United States Patent
Swillam et al.

(10) Patent No.: US 12,124,177 B2
(45) Date of Patent: Oct. 22, 2024

(54) OVERLAY MEASUREMENT SYSTEM USING LOCK-IN AMPLIFIER TECHNIQUE

(71) Applicants: ASML Holding N.V., Veldhoven (NL); ASML Netherlands B.V., Veldhoven (NL)

(72) Inventors: Mohamed Swillam, Wilton, CT (US); Simon Reinald Huisman, Eindhoven (NL); Justin Lloyd Kreuzer, Trumbull, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 152 days.

(21) Appl. No.: 17/782,622

(22) PCT Filed: Nov. 18, 2020

(86) PCT No.: PCT/EP2020/082575
§ 371 (c)(1),
(2) Date: Jun. 3, 2022

(87) PCT Pub. No.: WO2021/110416
PCT Pub. Date: Jun. 10, 2021

(65) Prior Publication Data
US 2023/0008139 A1 Jan. 12, 2023

Related U.S. Application Data

(60) Provisional application No. 62/943,876, filed on Dec. 5, 2019.

(51) Int. Cl.
*G03F 7/00* (2006.01)
*G03F 9/00* (2006.01)

(52) U.S. Cl.
CPC .... *G03F 7/706851* (2023.05); *G03F 7/70633* (2013.01); *G03F 7/7085* (2013.01); *G03F 9/7046* (2013.01); *G03F 9/7088* (2013.01)

(58) Field of Classification Search
CPC ...... G03F 7/7085; G03F 7/70633; G03F 7/70; G03F 7/70483–70541;
(Continued)

(56) References Cited

U.S. PATENT DOCUMENTS

| 5,333,050 A | * | 7/1994 | Nose | G03F 7/70633 356/490 |
|---|---|---|---|---|
| 5,498,878 A | | 3/1996 | Hasegawa et al. | |

(Continued)

OTHER PUBLICATIONS

International Search Report and Written Opinion of the International Searching Authority directed to related International Patent Application No. PCT/EP2020/082575, mailed Mar. 1, 2021; 10 pages.

(Continued)

*Primary Examiner* — Christina A Riddle
(74) *Attorney, Agent, or Firm* — Sterne, Kessler, Goldstein & Fox P.L.L.C.

(57) ABSTRACT

A detection system (200) includes an illumination system (210), a first optical system (232), a phase modulator (220), a lock-in detector (255), and a function generator (230). The illumination system is configured to transmit an illumination beam (218) along an illumination path. The first optical system is configured to transmit the illumination beam toward a diffraction target (204) on a substrate (202). The first optical system is further configured to transmit a signal beam including diffraction order sub-beams (222, 224, 226) that are diffracted by the diffraction target. The phase modulator is configured to modulate the illumination beam or the signal beam based on a reference signal. The lock-in detector is configured to collect the signal beam and to
(Continued)

measure a characteristic of the diffraction target based on the signal beam and the reference signal. The function generator is configured to generate the reference signal for the phase modulator and the lock-in detector.

21 Claims, 9 Drawing Sheets

(58) Field of Classification Search
CPC ... G03F 7/70608–70683; G03F 9/7046; G03F 9/7088; G03F 9/7069; G03F 9/70; G03F 9/7049; G03F 9/7065; G03F 9/7092; G03F 9/7096; G03F 7/70605–706851
USPC ...... 355/18, 30, 52–55, 67–77; 356/399–401
See application file for complete search history.

(56) References Cited

U.S. PATENT DOCUMENTS

| | | | | |
|---|---|---|---|---|
| 5,559,598 | A * | 9/1996 | Matsumoto | G03F 7/70633 356/490 |
| 2005/0111007 | A1 | 5/2005 | Hill et al. | |
| 2008/0069733 | A1 * | 3/2008 | Maltezos | B01L 3/50273 422/82.05 |
| 2016/0011523 | A1 * | 1/2016 | Singh | G01N 21/4788 355/77 |
| 2016/0061750 | A1 * | 3/2016 | Den Boef | G03F 7/70141 356/496 |
| 2016/0077445 | A1 * | 3/2016 | Den Boef | G03F 9/7088 356/400 |
| 2018/0107124 | A1 | 4/2018 | Tukker et al. | |
| 2018/0149987 | A1 * | 5/2018 | Mathijssen | G03F 7/70141 |
| 2018/0164699 | A1 * | 6/2018 | Tukker | G03F 9/7069 |
| 2019/0049866 | A1 | 2/2019 | Huisman et al. | |
| 2019/0356394 | A1 * | 11/2019 | Bunandar | G06F 17/16 |
| 2023/0296374 | A1 * | 9/2023 | Darwin | G03F 7/70633 356/400 |

OTHER PUBLICATIONS

International Preliminary Report on Patentability directed to related International Patent Application No. PCT/EP2020/082575, issued May 17, 2022; 7 pages.

* cited by examiner

OVERLAY MEASUREMENT SYSTEM USING LOCK-IN AMPLIFIER TECHNIQUE

CROSS-REFERENCE TO RELATED APPLICATIONS

This application claims priority of U.S. Provisional Patent Application No. 62/943,876, which was filed on Dec. 5, 2019, and which is incorporated herein in its entirety by reference.

BACKGROUND

Field

The present disclosure relates to detection apparatuses and systems for lithographic apparatuses and systems, for example.

Background

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In order to control the lithographic process to place device features accurately on the substrate, one or more diffraction targets (e.g., alignment marks) are generally provided on, for example, the substrate, and the lithographic apparatus includes one or more overlay and/or alignment sensors by which overlay and/or alignment errors can be measured accurately utilizing the diffraction target. However, transmission power loss in the overlay and/or alignment sensors can lead to a weak detection signal (e.g., overlay, alignment, etc.) with a low signal-to-noise ratio (SNR).

Lock-in amplifiers can provide sensitive detection and selective filtering of weak or noisy signals and can improve the SNR. Lock-in amplifier techniques can provide improved accuracy, faster detection times, and reduced noise in an overlay and/or alignment sensor. Further, compact integrated systems, for example, in a single "on chip" sensor, can provide a miniaturized sensor for measuring a particular characteristic (e.g., overlay, alignment, etc.) of an alignment mark on a substrate.

SUMMARY

Accordingly, there is a need to provide improved accuracy, faster detection times, and reduced noise in overlay and/or alignment sensors via lock-in amplifier techniques to better estimate and compensate for overlay and/or alignment errors, and provide a compact sensor capable of measuring overlay and/or alignment errors.

In some embodiments, a detection system includes an illumination system, a first optical system, a phase modulator, a lock-in detector, and a function generator. The illumination system is configured to transmit an illumination beam along an illumination path. The first optical system is configured to transmit the illumination beam toward a diffraction target on a substrate. The first optical system is further configured to transmit a signal beam including diffraction order sub-beams that are diffracted by the diffraction target. The phase modulator is configured to modulate the illumination beam or the signal beam based on a reference signal. The lock-in detector is configured to collect the signal beam and to measure a characteristic of the diffraction target based on the signal beam and the reference signal. The function generator is configured to generate the reference signal for the phase modulator and the lock-in detector.

In some embodiments, the illumination beam includes a phase modulated illumination beam based on the phase modulator and the reference signal from the function generator. In some embodiments, the illumination beam includes a first phase modulated illumination beam based on a first one of the reference signal from the function generator and a second phase modulated illumination beam based on a second one of the reference signal from the function generator.

In some embodiments, the phase modulator is configured to modulate a first diffraction order sub-beam of the signal beam toward the lock-in detector. In some embodiments, the signal beam includes a phase modulated signal beam based on the phase modulator and the reference signal from the function generator. In some embodiments, the reference signal includes a reference illumination beam from the illumination system.

In some embodiments, the first optical system includes a first beamsplitter configured to transmit a first diffraction order sub-beam of the signal beam toward the lock-in detector. In some embodiments, the reference signal includes the first diffraction order sub-beam of the signal beam.

In some embodiments, the illumination system, the lock-in detector, the phase modulator, and the function generator are integrated in an optics chip. In some embodiments, the lock-in detector includes a built-in lock-in amplifier for each pixel.

In some embodiments, the lock-in detector includes a balanced differential detector configured to output a differential signal. In some embodiments, the balanced differential detector includes an adiabatic coupler.

In some embodiments, the characteristic of the diffraction target is an overlay measurement.

In some embodiments, the detection system further includes a demodulator coupled to the lock-in detector and configured to separate multiple frequency signals of the signal beam.

In some embodiments, the illumination beam includes a coherent on-axis illumination beam. In some embodiments, the illumination beam includes a first coherent off-axis illumination beam and a second coherent off-axis illumination beam.

In some embodiments, the detection system further includes a tunable filter coupled to the illumination beam and configured to provide a plurality of different illumination beam wavelengths.

In some embodiments, a lithographic apparatus includes an illumination system, a projection system, and a detection system. The illumination system is configured to illuminate a patterning device. The projection system is configured to project an image of the patterning device onto a substrate.

The detection system is configured to measure a characteristic of a diffraction target on the substrate. The detection system includes a second illumination system, a first optical system, a phase modulator, a lock-in detector, and a function generator. The second illumination system is configured to transmit an illumination beam along an illumination path. The first optical system is configured to transmit the illumination beam toward the diffraction target on the substrate. The first optical system is further configured to transmit a signal beam including diffraction order sub-beams that are diffracted by the diffraction target. The phase modulator is configured to modulate the illumination beam or the signal beam based on a reference signal. The lock-in detector is configured to collect the signal beam and to measure a characteristic of the diffraction target based on the signal beam and the reference signal. The function generator is configured to generate the reference signal for the phase modulator and the lock-in detector.

In some embodiments, the characteristic of the diffraction target is an overlay measurement. In some embodiments, the characteristic of the diffraction target is an alignment measurement.

Further features and exemplary aspects of the embodiments, as well as the structure and operation of various embodiments, are described in detail below with reference to the accompanying drawings. It is noted that the embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the embodiments and, together with the description, further serve to explain the principles of the embodiments and to enable a person skilled in the relevant art(s) to make and use the embodiments.

Figure 1:
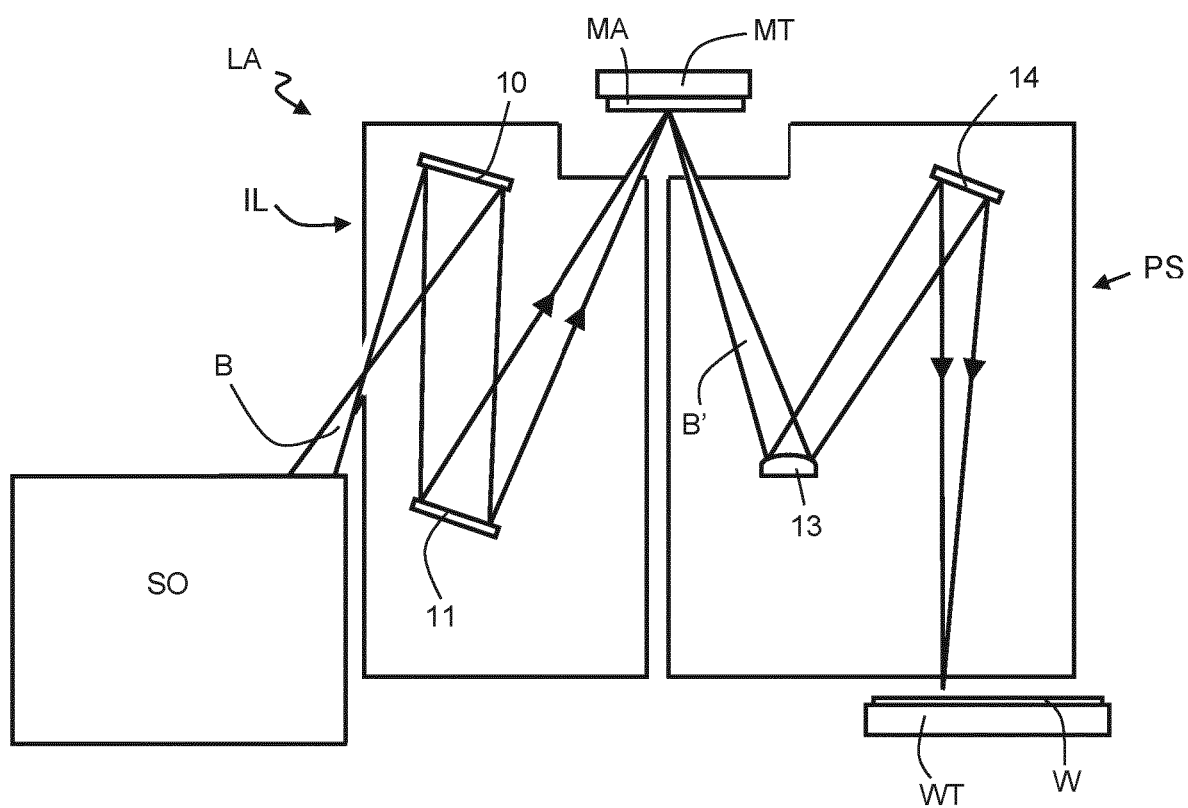
FIG. 1 is a schematic illustration of a lithographic apparatus, according to an exemplary embodiment.

The features and exemplary aspects of the embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this present invention. The disclosed embodiment(s) merely exemplify the present invention. The scope of the invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Exemplary Lithographic System

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV radiation beam B before the EUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL), or any other radiation source that is capable of generating EUV radiation.

Exemplary Detection Systems

As discussed above, in order to control the lithographic process to place device features accurately on the substrate, one or more diffraction targets (e.g., alignment marks) are generally provided on, for example, the substrate, and the lithographic apparatus can include one or more overlay sensors by which overlay errors (e.g., due to the interaction between sensors), on-product overlay (OPO) errors (e.g., due to the complexity of patterns and the quantity of pattern layers), and/or on-process accuracy (OPA) errors, based on varying stack thicknesses, materials, and/or processes on each wafer (e.g., process variations), can be measured accurately utilizing the diffraction target (e.g., micro diffraction-based overlay (µDBO)). Additionally or alternatively, the lithographic apparatus can include one or more alignment sensors by which the position of the diffraction target can be measured accurately and alignment distortions (e.g., intra-field distortion) can be reduced. However, transmission power loss (e.g., 50% to 75%) in the overlay and/or alignment sensor can lead to a weak detection signal (e.g., overlay, alignment, etc.) with a low signal-to-noise ratio (SNR).

Lock-in amplifiers use a technique known as phase-sensitive detection to single out a component of a signal at a specific reference frequency and phase, and can extract the signal from an extremely noisy background. Lock-in amplifiers rely on the orthogonality of sinusoidal functions and can multiply an input signal by a reference signal(s) and integrate the resulting signal over a specified time(s) (e.g., low-pass filter) to extract the desired components (e.g., phase and amplitude).

Lock-in amplifiers can use homodyne detection or heterodyne detection. Homodyne detection uses a single reference frequency (e.g., first frequency $f_1$) to extract the modulated signal. For example, homodyne detection extracts encoded information from an oscillating signal (e.g., phase and/or frequency) by comparing that signal with a standard reference oscillation (e.g., identical to the signal if it carried null information). Heterodyne detection uses two reference frequencies (e.g., first frequency $f_1$ and second frequency $f_2$) to extract the modulated signal. For example, heterodyne detection extracts encoded information from an oscillating signal (e.g., phase and/or frequency) by comparing that signal with a standard reference oscillation (e.g., identical to the signal if it carried null information) as well as comparing that signal with a beat frequency (e.g., difference) between the first and second frequencies (e.g., $f_1$-$f_2$). Further, by mixing two frequencies (e.g., $f_1$ and $f_2$), a higher frequency than a detector response time can be measured (e.g., $f_1$-$f_2$), and flicker noise (e.g., 1/f power spectral density) can be reduced.

Lock-in amplifier techniques can provide improved accuracy, faster detection times (e.g., simultaneous parallel detection), and reduced noise in an overlay and/or alignment sensor. For example, lock-in amplifiers can provide sensitive detection and selective filtering of weak or noisy signals (e.g., can extract a signal from the same level as the noise floor). Further, lock-in amplifier techniques can improve the SNR (e.g., up to 60 dB), perform phase sensitive detection, perform frequency-division multiplexing (FDM) for multiple wavelengths, and provide image (e.g., camera) based sensing.

Additionally, lock-in amplifier techniques do not require complex optics, a built-in reference signal can be used (e.g., reference illumination beam), and scanning can be avoided which reduces measurement times (e.g., 70 MHz modulation speed) and cross-talk between components. Lock-in cameras or lock-in charge-coupled devices (CCDs) can be implemented for accurate phase estimation and efficient phase retrieval for each pixel of a detected image. Further, compact integrated systems, for example, in a single "on chip" sensor, can provide a miniaturized sensor for measuring a particular characteristic (e.g., overlay, alignment, etc.) of an alignment mark on a substrate. Detection apparatuses and systems as discussed below can provide improved accuracy, faster detection times, and reduced noise via lock-in amplifier techniques to better estimate and compensate for overlay and/or alignment errors, for example, in a lithographic apparatus.

Exemplary On-Axis Detection Systems

Figure 2:
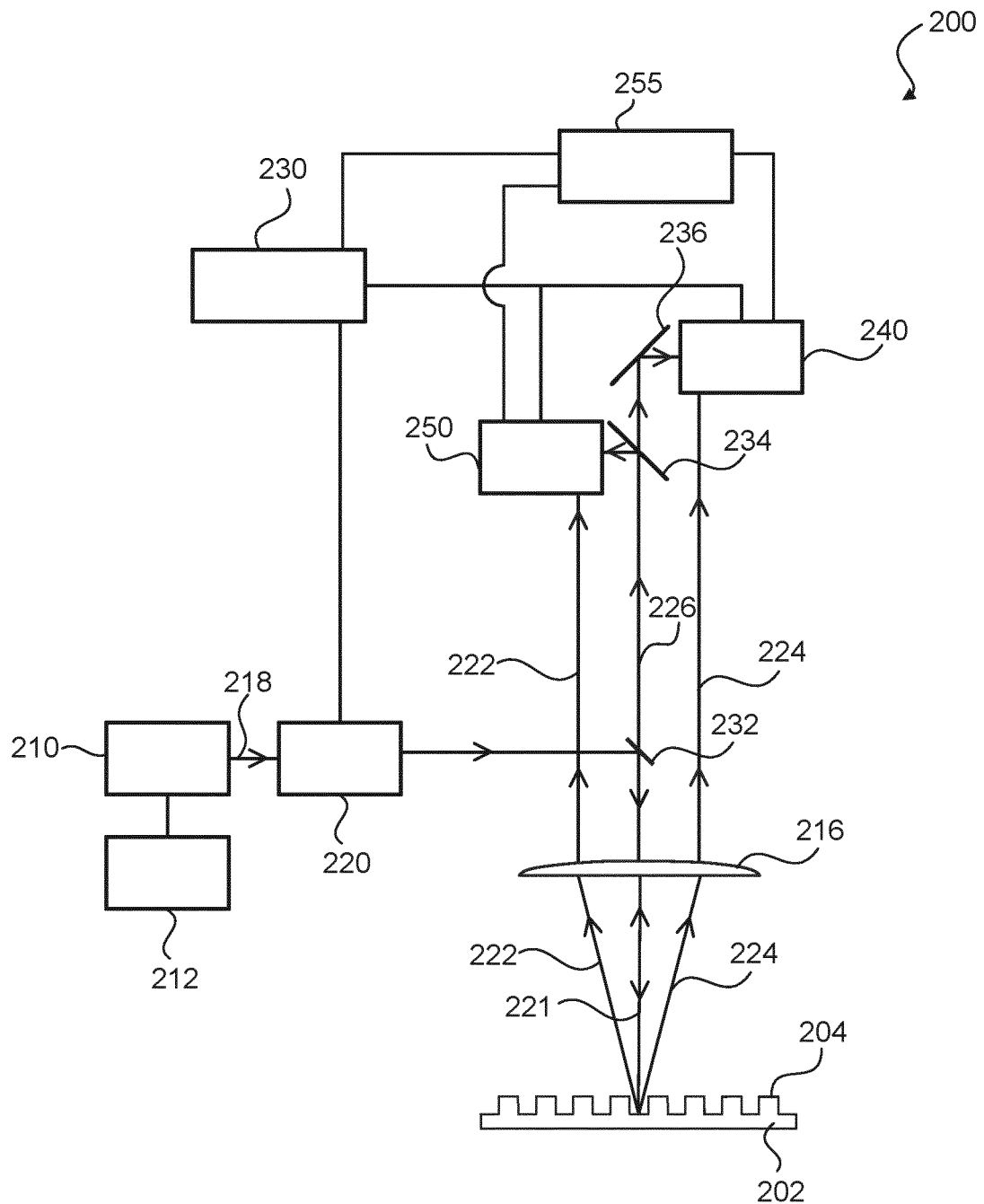
FIG. 2 is a schematic illustration of an on-axis detection system, according to an exemplary embodiment.
Figure 3:
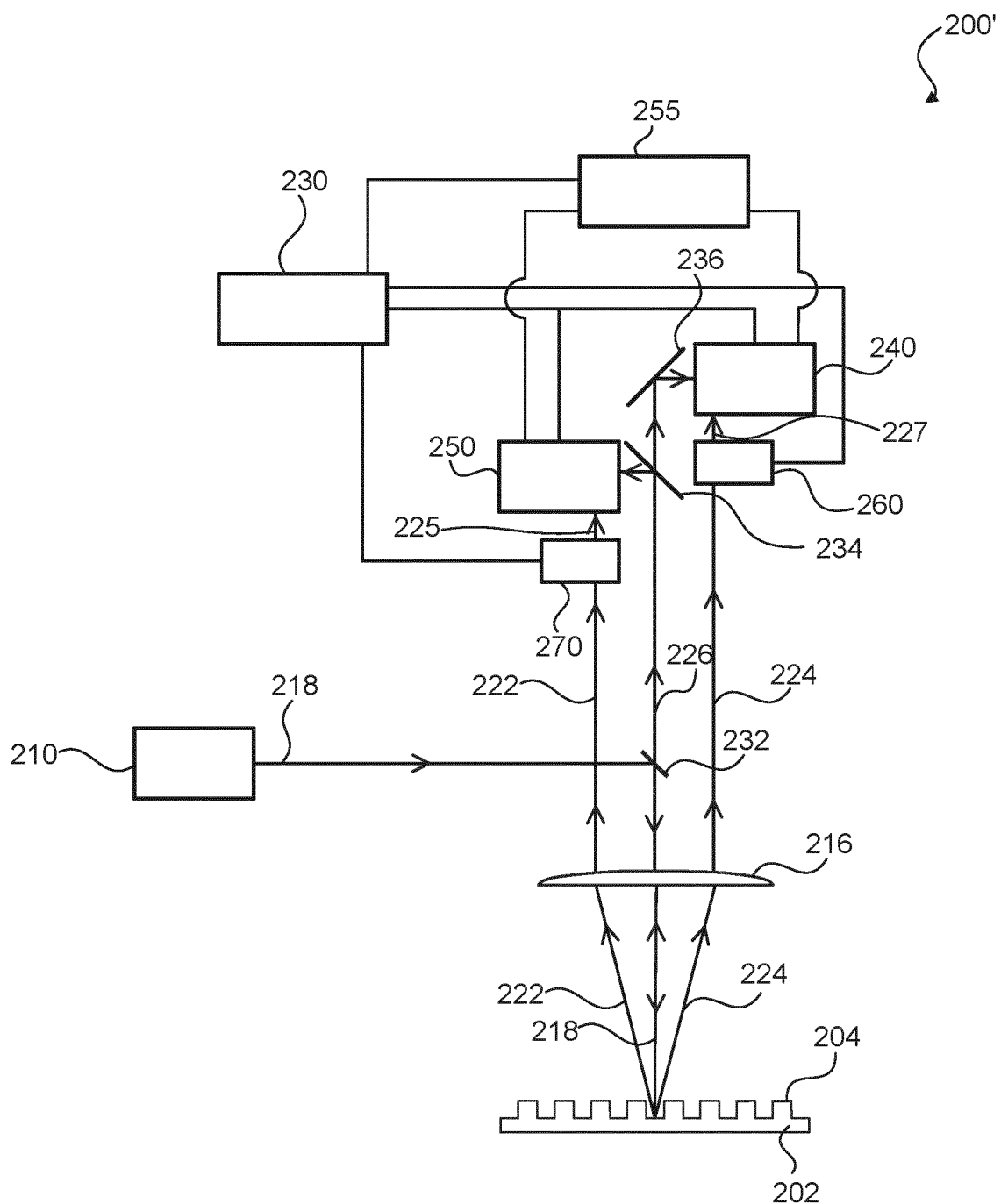
FIG. 3 is a schematic illustration of an on-axis detection system, according to an exemplary embodiment.
Figure 4:
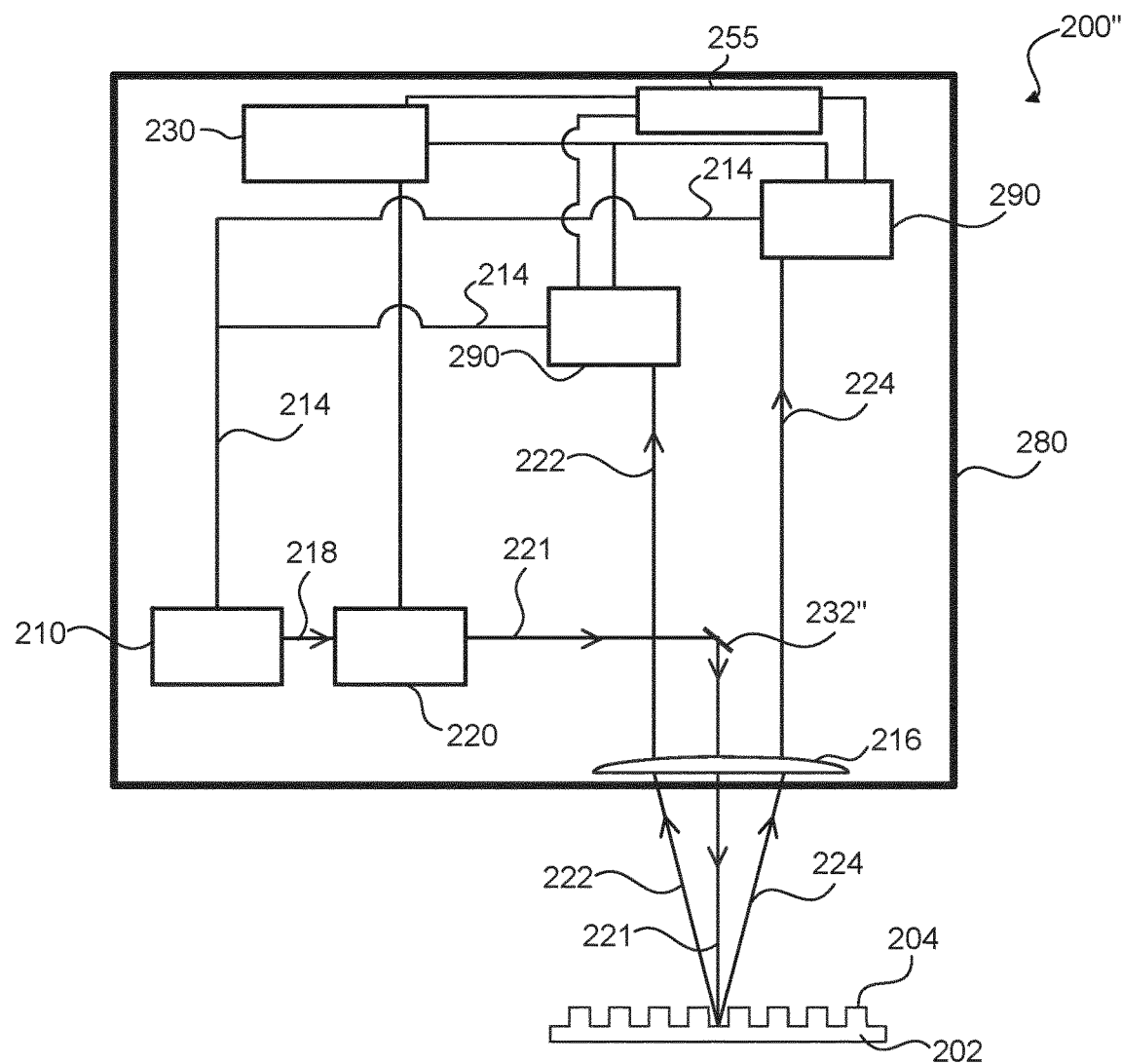
FIG. 4 is a schematic illustration of an on-chip on-axis detection system, according to an exemplary embodiment.

FIGS. 2-5 illustrate detection systems 200, 200', and 200", according to various exemplary embodiments. In some embodiments, as shown in FIGS. 2-4, detection systems 200, 200', and 200" can be on-axis detection systems.

FIG. 2 illustrates detection system 200, according to various exemplary embodiments. Detection system 200 can be configured to measure a characteristic (e.g., overlay, alignment, pitch, diffraction order, shift-between-orders (SBO), OPO, OPA, μDBO, intra-field distortion, etc.) of a diffraction target 204 on a substrate 202 and improve overlay and/or alignment, for example, in lithographic apparatus LA. Although detection system 200 is shown in FIG. 2 as a stand-alone apparatus and/or system, the embodiments of this disclosure can be used with other optical systems, such as, but not limited to, lithographic apparatus LA and/or other optical systems.

Detection system 200 can include illumination system 210, focusing lens 216, first beamsplitter 232, phase modulator 220, function generator 230, first phase detector 240, second phase detector 250, and lock-in detector 255. In some embodiments, as shown in FIG. 2, detection system 200 can be an on-axis (e.g., illumination beam is perpendicular to diffraction target) homodyne (e.g., single reference frequency) detection system. In some embodiments, substrate 202 can include a plurality of reference alignment marks, for example, each similar to diffraction target 204. In some embodiments, substrate 202 can be substrate W in lithographic apparatus LA.

Illumination system 210 can be configured to transmit an illumination beam 218 along an illumination path toward phase modulator 220 and/or first beamsplitter 232. For example, as shown in FIG. 2, illumination beam 218 can be directed to phase modulator 220 to produce modulated illumination beam 221 (e.g., at first frequency $f_1$) directed towards first beamsplitter 232. In some embodiments, illumination system 210 can be a white light source (WLS). In some embodiments, as shown in FIG. 2, illumination system 210 can include a tunable filter 212 configured to provide a plurality of different illumination beam wavelengths. For example, tunable filter 212 can be a prism, an acousto-optic modulator (AOM), an electro-optic modulator (EOM), a bandpass filter, and/or any other suitable optical filter capable of wavelength selection. In some embodiments, as shown in FIG. 3, illumination beam 218 can include a coherent on-axis illumination beam 218. In some embodiments, illumination system 210 can include a broadband light source for a radiation source with a large etendue and allowing for mixing of multiple wavelengths.

First beamsplitter 232 can be configured to transmit illumination beam 218 or modulated illumination beam 221 toward diffraction target 204 on substrate 202. First beamsplitter 232 can form a 45° angle with the illumination path to direct illumination beam 218 or modulated illumination beam 221 toward focusing lens 216 and diffraction target 204. Additionally, in some embodiments, as shown in FIGS. 2 and 3, first beamsplitter 232 can be configured to transmit a signal beam (e.g., first diffraction (0th) order sub-beam 226, second diffraction (−1) order sub-beam 222, third diffraction (+1) order sub-beam 224) diffracted by diffraction target 204. For example, as shown in FIG. 2, first beamsplitter 232 can be configured to reflect a first portion (e.g., 50%) of illumination beam 218 or modulated illumination beam 221 toward substrate 202 and transmit a second portion (e.g., 50%) of signal beam (e.g., first diffraction (0th) order sub-beam 226) toward second beamsplitter 234 and first mirror 236 and second phase detector 250 and first phase detector 240, respectively.

In some embodiments, as shown in FIGS. 2 and 3, first beamsplitter 232 can be configured to transmit first diffraction (0th) order sub-beam 226 of the signal beam toward first phase detector 240, second phase detector 250, and/or lock-in detector 255. In some embodiments, as shown in FIG. 4, first beamsplitter 232 can be a reflective mirror incapable of transmission (e.g., second mirror 232") and configured to block first diffraction (0th) order sub-beam 226. In some embodiments, first beamsplitter 232 can be a polarizing beamsplitter (e.g., p-polarized, s-polarized) and illumination beam 218 or modulated illumination beam 221 can be polarized (e.g., transverse-magnetic (TM), transverse-electric (TE)).

Focusing lens 216 can be configured to focus illumination beam 218 or modulated illumination beam 221 on diffraction target 204 and collect a signal beam (e.g., first diffraction (0th) order sub-beam 226, second diffraction (−1) order sub-beam 222, third diffraction (+1) order sub-beam 224) diffracted by diffraction target 204. In some embodiments, focusing lens 216 can be positioned at the pupil plane of detection system 200 (e.g., plane in which the radial position of the radiation defines the angle of incidence and the angular position defines the azimuth angle of the radiation). In some embodiments, diffraction target 204 can be an alignment mark, a 1-D diffraction grating, and/or a 2-D diffraction grating.

Focused illumination beam 218 or modulated illumination beam 221 on diffraction target 204 creates a signal beam along a signal path with diffraction order sub-beams, for example, first diffraction (0th) order sub-beam 226, second diffraction (−1) order sub-beam 222, and/or third diffraction (+1) order sub-beam 224.

Phase modulator 220 can be configured to modulate illumination beam 218 or signal beam (e.g., second diffraction (−1) order sub-beam 222 and/or third diffraction (+1) order sub-beam 224) based on a reference signal (e.g., first frequency $f_1$) from function generator 230. Phase modulator 220 can include, but is not limited to, a mechanical modulator (e.g., a chopper), an acousto-optic modulator (AOM), an electro-optic modulator (EOM), a liquid crystal modulator (LCM), a digital micromirror device (DMD), a microelectromechanical system (MEMS), a piezoelectric modulator, a frequency swept laser source, a tunable laser source, an amplitude modulator, a frequency modulator, and/or any combination thereof. For example, as shown in FIG. 2, illumination beam 218 can be directed to phase modulator 220 (e.g., a chopper) that modulates illumination beam 218 (e.g., frequency modulation) to produce modulated illumination beam 221 with an embedded reference signal (e.g., at first frequency $f_1$) from function generator 230.

In some embodiments, as shown in FIG. 2, phase modulator 220 can be configured to modulate first diffraction (0th) order sub-beam 226, second diffraction (−1) order sub-beam 222, and/or third diffraction (+1) order sub-beam 224 toward first phase detector 240, second phase detector 250, and/or lock-in detector 255. For example, as shown in FIG. 2, first diffraction (0th) order sub-beam 226 can be modulated by phase modulator 220 toward first and second phase detectors 240, 250 via second beamsplitter 234 and first mirror 236, respectively.

In some embodiments, phase modulator 220 can include a plurality of phase modulators (e.g., first phase modulator 260, second phase modulator 270, etc.). For example, as shown in FIG. 3, first phase modulator 260 can modulate third diffraction (+1) order sub-beam 224 with a first reference signal (e.g., first frequency $f_1$) from function generator 230 to produce modulated third diffraction (+1) order sub-beam 227 (e.g., at first frequency $f_1$), and second phase modulator 270 can modulate second diffraction (−1) order sub-beam 222 with a second reference signal (e.g., second frequency $f_2$) from function generator 230 to produce modulated second diffraction (−1) order sub-beam 225 (e.g., at second frequency $f_2$).

Function generator 230 can be configured to generate a reference signal (e.g., first frequency $f_1$) for phase modulator 220. Function generator 230 can generate a variety of electrical waveforms over a wide range of frequencies (e.g., one or more reference signals). Function generator 230 can be coupled (e.g., electrically) to phase modulator 220, first phase detector 240, second phase detector 250, and/or lock-in detector 255. In some embodiments, as shown in FIG. 2, function generator 230 can be configured to generate a reference signal (e.g., first frequency $f_1$) to phase modulator 220, first phase detector 240, second phase detector 250, and/or lock-in detector 255.

One or more reference signals (e.g., first frequency $f_1$) can be provided by function generator 230 to phase modulator 220, first phase detector 240, second phase detector 250, and/or lock-in detector 255 for lock-in amplifier techniques. In some embodiments, signal beam (e.g., first diffraction (0th) order sub-beam 226, second diffraction (−1) order sub-beam 222, and/or third diffraction (+1) order sub-beam 224) can include a phase modulated signal beam (e.g., first diffraction (0th) order sub-beam 226) based on phase modulator 220 and a reference signal (e.g., first frequency $f_1$) from function generator 230. In some embodiments, as shown in FIGS. 2 and 3, a reference signal (e.g., first frequency $f_1$) can include first diffraction (0th) order sub-beam 226 of signal beam. In some embodiments, as shown in FIG. 4, a reference signal (e.g., first amplitude $A_1$ and/or first frequency $f_1$) can include a reference illumination beam 214 from illumination system 210.

First phase detector 240 can be configured to detect third diffraction (+1) order sub-beam 224 and/or first diffraction (0th) order sub-beam 226. First phase detector 240 can be coupled (e.g., electrically) to function generator 230 and/or lock-in detector 255. First phase detector 240 can be any optical detector (e.g., CCD, camera, photodiode, photoconductor, phototransistor, CMOS, lock-in CCD, lock-in camera, etc.).

Second phase detector 250 can be configured to detect second diffraction (−1) order sub-beam 222 and/or first diffraction (0th) order sub-beam 226. Second phase detector 250 can be coupled (e.g., electrically) to function generator 230 and/or lock-in detector 255. Second phase detector 250 can be any optical detector (e.g., CCD, camera, photodiode, photoconductor, phototransistor, CMOS, lock-in CCD, lock-in camera, etc.).

As shown in FIG. 2, an exemplary aspect of the optical setup of detection system 200 is balanced detection with a lock-in amplifier technique (e.g., homodyne detection). Both first and second phase detectors 240, 250 receive first diffraction (0th) order sub-beam 226. Signal inputs third diffraction (+1) order sub-beam 224 and second diffraction (−1) order sub-beam 222, respectively, can be normalized (e.g., background subtract first diffraction (0th) order sub-beam 226 intensity) for balanced detection. First diffraction (0th) order sub-beam 226, with embedded modulation from a reference signal (e.g., first frequency $f_1$), can be utilized in a lock-in amplifier technique (e.g., homodyne detection) to improve accuracy and SNR of second diffraction (−1) order sub-beam 222 and third diffraction (+1) order sub-beam 224.

In some embodiments, first phase detector 240 and second phase detector 250 can be configured to collect a signal beam (e.g., first diffraction (0th) order sub-beam 226, second diffraction (−1) order sub-beam 222, and third diffraction (+1) order sub-beam 224) and measure a characteristic (e.g., overlay, alignment, pitch, diffraction order, shift-between-orders (SBO), OPO, OPA, μDBO, intra-field distortion, etc.) of diffraction target 204 based on the signal beam and a reference signal (e.g., first frequency $f_1$) from function generator 230. For example, as shown in FIG. 2, a lock-in amplifier technique can be used with the reference signal (e.g., first frequency $f_1$) from function generator 230 embedded on first diffraction (0th) order sub-beam 226, second diffraction (−1) order sub-beam 222, and third diffraction (+1) order sub-beam 224, and a differential value between second diffraction (−1) order sub-beam 222 and third diffraction (+1) order sub-beam 224 can be measured (e.g., phase shift).

In some embodiments, first phase detector 240 and second phase detector 250 can be identical. In some embodiments, first phase detector 240 and second phase detector 250 can be a single detector (e.g., lock-in detector 255). In some embodiments, first phase detector 240 and/or second phase detector 250 can include a lock-in amplifier (e.g., similar to lock-in detector 255). In some embodiments, first phase detector 240 and/or second phase detector 250 can include a built-in lock-in amplifier for each pixel. For example, a lock-in CMOS camera (e.g., C2 heliCam™ by Heliotis AG).

Lock-in detector 255 can be configured to collect a signal beam (e.g., from first and second phase detectors 240, 250) and measure a characteristic (e.g., overlay, alignment, pitch, diffraction order, shift-between-orders (SBO), OPO, OPA, μDBO, intra-field distortion, etc.) of diffraction target 204 on substrate 202 based on the signal beam and a reference signal (e.g., first frequency $f_1$) from function generator 230. Lock-in detector 255 can be coupled to function generator 230, first phase detector 240, and second phase detector 250. Lock-in detector 255 can receive a first input signal from first phase detector 240, a second input signal from second phase detector 250, and a reference signal (e.g., first frequency $f_1$) from function generator 230 in order to conduct a differential lock-in amplifier technique. For example, a differential (e.g., difference) signal between first and second input signals can be extracted by the reference signal (e.g., homodyne detection).

Figure 5:
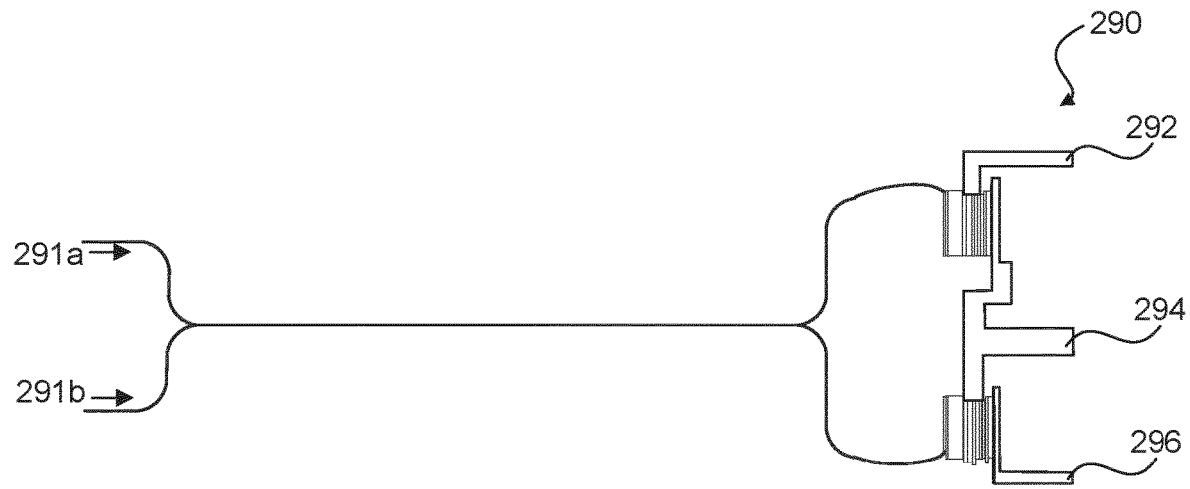
FIG. 5 is a schematic illustration of a balanced differential detector, according to an exemplary embodiment.

In some embodiments, as shown in FIG. 2, lock-in detector 255 can be external to first and second phase detectors 240, 250. In some embodiments, first phase detector 240 and/or second phase detector 250 can include lock-in detector 255 (e.g., lock-in detector 255 can be embedded). In some embodiments, as shown in FIG. 4, lock-in detector 255 can include a balanced differential detector 290 configured to output a differential (e.g., difference) signal. For example, as shown in FIG. 5, balanced differential detector 290 can include an adiabatic coupler (e.g., inherent 50% power splitting). In some embodiments, lock-in detector 255 can include a built-in lock-in amplifier for each pixel. For example, a lock-in CMOS camera (e.g., C2 heliCam™ by Heliotis AG). In some embodiments, as shown in FIG. 4, illumination system 210, phase modulator 220, function generator 230, first phase detector 240, second phase detector 250, and/or lock-in detector 255 can be combined in an integrated optics chip 280.

FIG. 3 illustrates detection system 200', according to an exemplary embodiment. The embodiments of detection system 200 shown in FIG. 2 and the embodiments of detection system 200' shown in FIG. 3 may be similar. Similar reference numbers are used to indicate similar features of the embodiments of detection system 200 shown in FIG. 2 and the similar features of the embodiments of detection system 200' shown in FIG. 3. The main difference between the embodiments of detection system 200 shown in FIG. 2 and the embodiments of detection system 200' shown in FIG. 3 is that detection system 200' includes first and second phase modulators 260, 270 positioned near first and second phase detectors 240, 250 to modulate second diffraction (−1) order sub-beam 222 and third diffraction (+1) order sub-beam 224 of signal beam to form modulated second diffraction (−1) order sub-beam 225 and modulated third diffraction (+1) order sub-beam 227, respectively, rather than phase modulator 220 modulating illumination beam 218 shown in FIG. 2.

As shown in FIG. 3, an exemplary aspect of the optical setup of detection system 200' is balanced detection with a lock-in amplifier technique (e.g. heterodyne detection). Both first and second phase detectors 240, 250 receive (unmodulated) first diffraction (0th) order sub-beam 226. First and second phase modulators 260, 270 receive different reference signals (e.g., first frequency $f_1$ and second frequency $f_2$), respectively. Signal inputs modulated third diffraction (+1) order sub-beam 227 and modulated second diffraction (−1) order sub-beam 225, respectively, can be normalized (e.g., background subtract (unmodulated) first diffraction (0th) order sub-beam 226 intensity) for balanced detection. Modulated third diffraction (+1) order sub-beam 227, with embedded modulation from first reference signal (e.g., first frequency $f_1$), and modulated second diffraction (−1) order sub-beam 225, with embedded modulation from second reference signal (e.g., second frequency $f_2$), can be utilized in a lock-in amplifier technique (e.g., heterodyne detection) to improve accuracy and SNR of second diffraction (−1) order sub-beam 222 and third diffraction (+1) order sub-beam 224.

Further, as shown in FIG. 3, another exemplary aspect of detection system 200' is that lock-in detector 255 can receive a first input signal from first phase detector 240, a second input signal from second phase detector 250, and two reference signals (e.g., first frequency $f_1$ and second frequency $f_2$) from function generator 230 in order to conduct a differential lock-in amplifier technique. For example, a differential (e.g., difference) signal between first and second input signals can be extracted by the two reference signals (e.g., heterodyne detection).

FIGS. 4 and 5 illustrate detection system 200", according to an exemplary embodiment. The embodiments of detection system 200 shown in FIG. 2 and the embodiments of detection system 200" shown in FIGS. 4 and 5 may be similar. Similar reference numbers are used to indicate similar features of the embodiments of detection system 200 shown in FIG. 2 and the similar features of the embodiments of detection system 200" shown in FIGS. 4 and 5. The main differences between the embodiments of detection system 200 shown in FIG. 2 and the embodiments of detection system 200" shown in FIGS. 4 and 5 is that (1) detection system 200" includes a balanced differential detector 290 that receives a reference illumination beam 214 from illumination system 210, rather than first and second phase detectors 240, 250 shown in FIG. 2; (2) detection system 200" includes second mirror 232" to block first diffraction (0th) order sub-beam 226, rather than first beamsplitter 232 shown in FIG. 2; and (3) detection system 200" combines all of the components of detection system 200 (e.g., illumination system 210, first beamsplitter 232, focusing lens 216, phase modulator 220, function generator 230, first phase detector 240, second phase detector 250, lock-in detector 255, etc.) into an integrated optics chip 280.

As shown in FIGS. 4 and 5, an exemplary aspect of the optical setup of detection system 200" is balanced detection with balanced differential detector 290. In some embodiments, as shown in FIG. 5, balanced differential detector 290 can include an adiabatic coupler (e.g., inherent 50% power splitting). As shown in FIG. 5, balanced differential detector 290 can be configured to receive a first input 291a (e.g., reference illumination beam 214) and a second input 291b (e.g., second diffraction (−1) order sub-beam 222, third diffraction (+1) order sub-beam 224) that can be compared differentially (e.g., difference) via bias 292 and ground 296 to output signal 294. Moreover, use of balanced differential detector 290 (e.g., an adiabatic coupler) allows for further miniaturization of detection system 200". As shown in FIG. 4, integrated optics chip 280 provides a single "on chip" sensor for a compact detection system 200" for measuring a particular characteristic (e.g., overlay, alignment, etc.) of diffraction target 204.

As shown in FIG. 4, an exemplary aspect of detection system 200" is balanced detection with reference illumination beam 214 and omission of first diffraction (0th) order sub-beam 226 via second mirror 232" with a lock-in amplifier technique (e.g., homodyne detection). Both balanced differential detectors 290 receive (unmodulated) reference illumination beam 214. Phase modulator 220 receives a reference signal (e.g., first frequency $f_1$) from function generator 230. Signal inputs third diffraction (+1) order sub-beam 224 and second diffraction (−1) order sub-beam 222, respectively, can be normalized (e.g., background subtract reference illumination beam 214 intensity) for balanced detection. Second diffraction (−1) order sub-beam 222 and third diffraction (+1) order sub-beam 224, both with embedded modulation from the reference signal (e.g., first frequency $f_1$), can be utilized in a lock-in amplifier technique (e.g., homodyne detection) to improve accuracy and SNR of second diffraction (−1) order sub-beam 222 and third diffraction (+1) order sub-beam 224.

Exemplary Off-Axis Detection Systems

Figure 6:
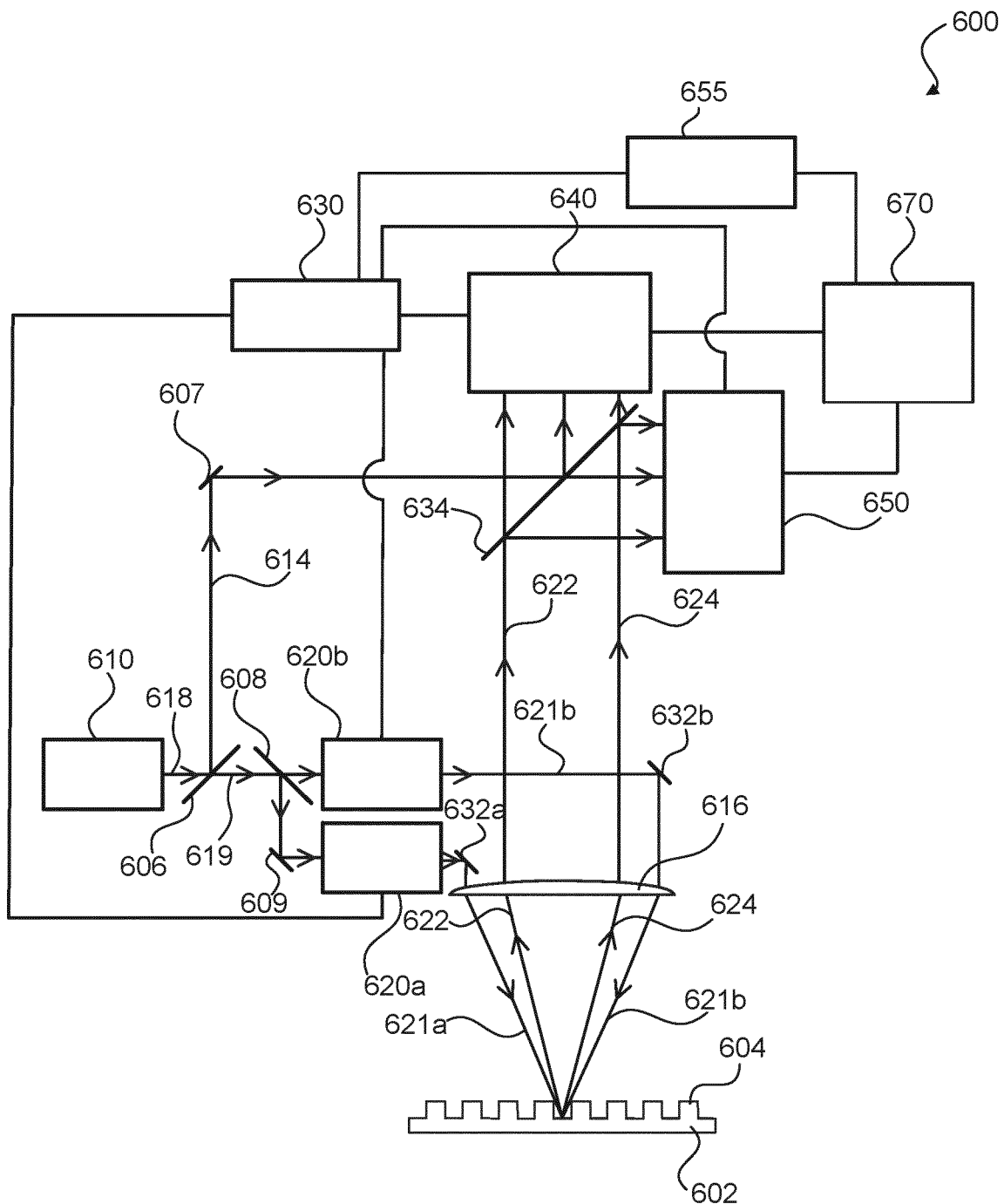
FIG. 6 is a schematic illustration of an off-axis detection system, according to an exemplary embodiment.
Figure 7:
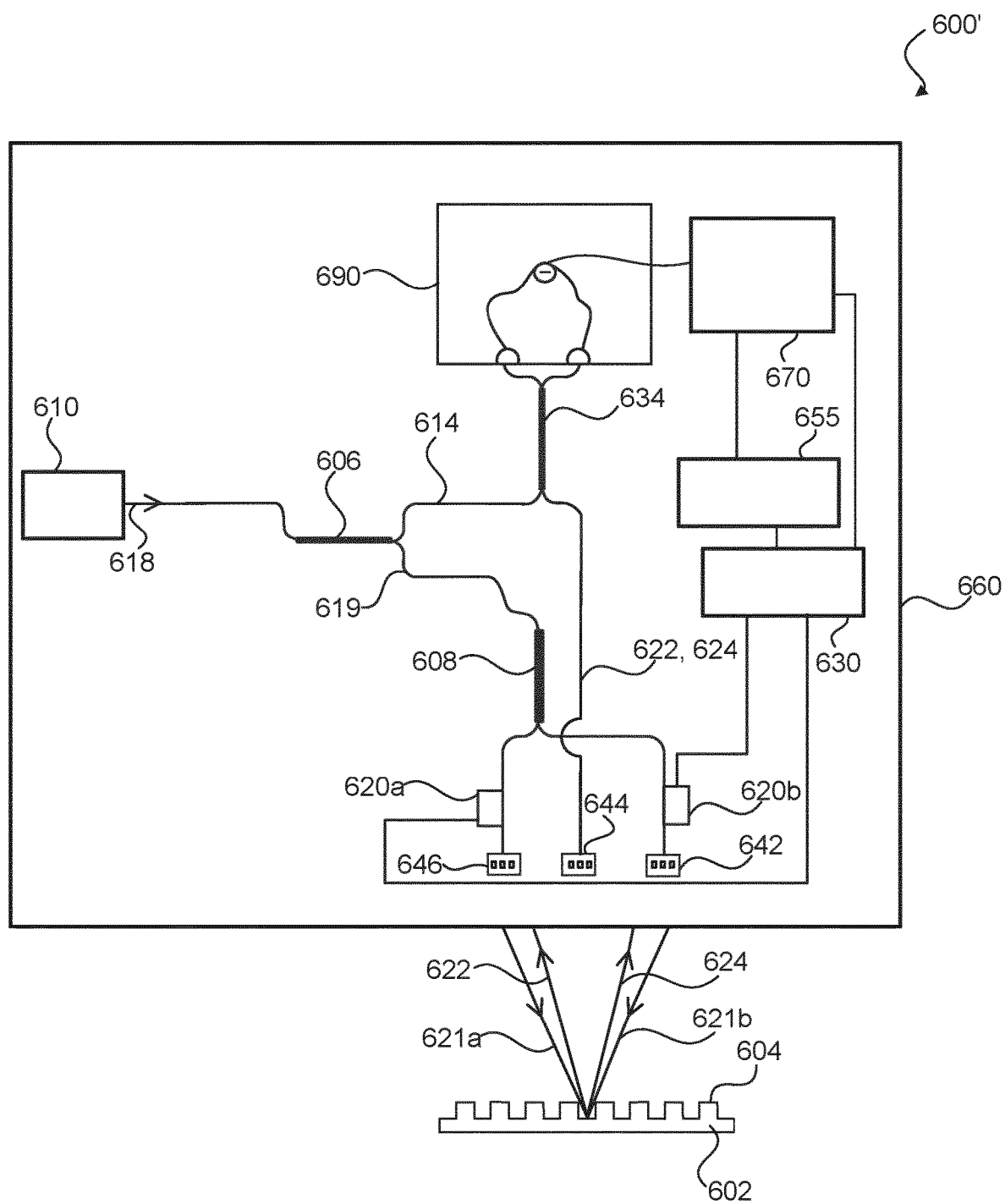
FIG. 7 is a schematic illustration of an on-chip off-axis detection system, according to an exemplary embodiment.

FIGS. 6-9 illustrate detection systems 600 and 600', according to various exemplary embodiments. In some embodiments, as shown in FIGS. 6 and 7, detection systems 600 and 600' can be off-axis detection systems.

FIG. 6 illustrates detection system 600, according to various exemplary embodiments. Detection system 600 can be configured to measure a characteristic (e.g., overlay, alignment, pitch, diffraction order, shift-between-orders (SBO), OPO, OPA, μDBO, intra-field distortion, etc.) of a diffraction target 604 on a substrate 602 and improve overlay and/or alignment, for example, in lithographic apparatus LA. Although detection system 600 is shown in FIG. 6 as a stand-alone apparatus and/or system, the embodiments of this disclosure can be used with other optical systems, such as, but not limited to, lithographic apparatus LA and/or other optical systems. Detection system 600 shown in FIG. 6 is similar to detection system 200 shown in FIG. 2, and similar reference numbers are used to describe similar features.

Detection system 600 can include illumination system 610, focusing lens 616, first beamsplitter 606, first mirror 607, second beamsplitter 608, second mirror 609, reference illumination beam 614, first phase modulator 620a, second phase modulator 620b, function generator 630, third mirror 632a, fourth mirror 632b, third beamsplitter 634, first phase detector 640, second phase detector 650, lock-in detector 655, and demodulator 670. In some embodiments, as shown in FIG. 6, detection system 600 can be an off-axis (e.g., angled illumination beams are not perpendicular to diffraction target) heterodyne (e.g., two reference frequencies) detection system. In some embodiments, substrate 602 can include a plurality of reference alignment marks, for example, each similar to diffraction target 604. In some embodiments, substrate 602 can be substrate W in lithographic apparatus LA.

Illumination system 610 can be configured to transmit an illumination beam 618 along an illumination path toward first beamsplitter 606 to form a reference illumination beam 614 (e.g., 10%) and a beamsplit illumination beam 619 (e.g., 90%). For example, as shown in FIG. 6, illumination beam 618 can be directed to first beamsplitter 606 and form reference illumination beam 614 directed towards first mirror 607 and first and second phase detectors 640, 650, and beamsplit illumination beam 619 directed towards first and second phase modulators 620a, 620b. Beamsplit illumination beam 619 can be split and separated towards first and second phase modulators 620a, 620b via second beamsplitter 608 and second mirror 609, respectively. For example, as shown in FIG. 6, beamsplit illumination beam 619 can be directed to first phase modulator 620a to produce first modulated illumination beam 621a (e.g., at first frequency $f_1$) directed towards third mirror 632a and second modulated illumination beam 621b (e.g., at second frequency $f_2$) directed towards fourth mirror 632b.

In some embodiments, illumination system 610 can be a white light source (WLS). In some embodiments, as shown in FIG. 2, illumination system 610 can include a tunable filter 212 configured to provide a plurality of different illumination beam wavelengths. For example, tunable filter 212 can be a prism, an acousto-optic modulator (AOM), an electro-optic modulator (EOM), a bandpass filter, and/or any other suitable optical filter capable of wavelength selection. In some embodiments, as shown in FIG. 6, illumination beam 618 can include a first coherent off-axis illumination beam 621a and a second coherent off-axis illumination beam 621b. In some embodiments, illumination system 610 can include a broadband light source for a radiation source with a large etendue and allowing for mixing of multiple wavelengths.

In some embodiments, as shown in FIG. 6, illumination beam 618 can include a first modulated illumination beam 621a based on a first reference signal (e.g., first frequency $f_1$) from function generator 630 and a second modulated illumination beam 621b based on a second reference signal (e.g., second frequency $f_2$) from function generator 630. For example, first and second reference signals (e.g., first frequency $f_1$ and second frequency $f_2$) can be different (e.g., $f_1 \neq f_2$).

Third and fourth mirrors 632a, 632b can be configured to transmit first and second modulated illumination beams 621a, 621b, respectively, toward diffraction target 604 on substrate 602. Third and fourth mirrors 632a, 632b can form a 45° angle with the illumination path to direct first and second modulated illumination beams 621a, 621b, respectively, toward focusing lens 616 and diffraction target 604. In some embodiments, as shown in FIG. 6, third and fourth mirrors 632a, 632b can be reflective mirrors incapable of transmission and configured to block a diffraction (0th) order sub-beam.

As shown in FIG. 6, focusing lens 616 can be configured to focus first and second modulated illumination beams 621a, 621b on diffraction target 604 and collect a signal beam (e.g., first diffraction (−1) order sub-beam 622 and second diffraction (+1) order sub-beam 624) diffracted by diffraction target 604. In some embodiments, focusing lens 616 can be positioned at the pupil plane of detection system 600 (e.g., plane in which the radial position of the radiation defines the angle of incidence and the angular position defines the azimuth angle of the radiation). In some embodiments, diffraction target 604 can be an alignment mark, a 1-D diffraction grating, and/or a 2-D diffraction grating.

First and second modulated illumination beams 621a, 621b on diffraction target 604 can create a signal beam along a signal path with diffraction order sub-beams, for example, first diffraction (−1) order sub-beam 622 and second diffraction (+1) order sub-beam 624. Focusing lens 616 can be configured to transmit the signal beam (e.g., first diffraction (−1) order sub-beam 622 and second diffraction (+1) order sub-beam 624) diffracted by diffraction target 604 toward third beamsplitter 634 and to first and second phase detectors 640, 650. In some embodiments, as shown in FIG. 6, third beamsplitter 634 can be configured to transmit reference illumination beam 614 and first diffraction (−1) order sub-beam 622 and second diffraction (+1) order sub-beam 624 of the signal beam toward first phase detector 640 and/or second phase detector 650.

First and second phase modulators 620a, 620b can be configured to modulate beamsplit illumination beam 619 based on a first reference signal (e.g., first frequency $f_1$) from function generator 630 to produce first modulated illumination beam 621a and a second reference signal (e.g., second frequency $f_2$) from function generator 630 to produce second modulated illumination beam 621b, respectively. First and second phase modulators 620a, 620b can include, but is not limited to, a mechanical modulator (e.g., a chopper), an acousto-optic modulator (AOM), an electro-optic modulator (EOM), a liquid crystal modulator (LCM), a digital micromirror device (DMD), a microelectromechanical system (MEMS), a piezoelectric modulator, a frequency swept laser source, a tunable laser source, an amplitude modulator, a frequency modulator, and/or any combination thereof. For example, as shown in FIG. 6, beamsplit illumination beam 619 can be directed to first phase modulator 620a (e.g., a first AOM) that modulates beamsplit illumination beam 619 (e.g., frequency modulation) to produce first modulated illumination beam 621a with an embedded first reference signal (e.g., at first frequency $f_1$) from function generator 630, and beamsplit illumination beam 619 can be directed to second phase modulator 620b (e.g., a second AOM) that modulates beamsplit illumination beam 619 (e.g., frequency modulation) to produce second modulated illumination beam 621b with an embedded second reference signal (e.g., at second frequency $f_2$) from function generator 630.

Function generator 630 can be configured to generate a first reference signal (e.g., first frequency $f_1$) for first phase modulator 620a and a second reference signal (e.g., second frequency $f_2$) for second phase modulator 620b. Function generator 630 can generate a variety of electrical waveforms over a wide range of frequencies (e.g., one or more reference signals). Function generator 630 can be coupled (e.g., electrically) to first phase modulator 620a, second phase modulator 620b, first phase detector 640, second phase detector 650, and/or lock-in detector 655. In some embodiments, as shown in FIG. 6, function generator 630 can be configured to generate a first reference signal (e.g., first frequency $f_1$) and/or a second reference signal (e.g., second frequency $f_2$) to first phase modulator 620a, second phase modulator 620b, first phase detector 640, second phase detector 650, lock-in detector 655, and/or demodulator 670.

One or more reference signals (e.g., first frequency $f_1$, second frequency $f_2$) can be provided by function generator 630 to first phase modulator 620a, second phase modulator 620b, first phase detector 640, second phase detector 650, and/or lock-in detector 655 for lock-in amplifier techniques. In some embodiments, signal beam (e.g., first diffraction (−1) order sub-beam 622 and second diffraction (+1) order sub-beam 624) can include a first phase modulated signal beam (e.g., first diffraction (−1) order sub-beam 622) based on first phase modulator 620a and a first reference signal (e.g., first frequency $f_1$) from function generator 630, and a second phase modulated signal beam (e.g., second diffraction (+1) order sub-beam 624) based on second phase modulator 620b and a second reference signal (e.g., second frequency $f_2$) from function generator 630. In some embodiments, a reference signal (e.g., first amplitude $A_1$ and/or first frequency $f_1$) can include a reference illumination beam 614 from illumination system 610.

First phase detector 640 can be configured to detect first diffraction (−1) order sub-beam 622, second diffraction (+1) order sub-beam 624, and/or reference illumination beam 614. First phase detector 640 can be coupled (e.g., electrically) to function generator 630 and/or demodulator 670. First phase detector 640 can be any optical detector (e.g., CCD, camera, photodiode, photoconductor, phototransistor, CMOS, lock-in CCD, lock-in camera, etc.). In some embodiments, first phase detector 640 can be configured for image based sensing (e.g., all of signal beam, multiple wavelengths). In some embodiments, first phase detector 640 can be coupled (e.g., electrically) to lock-in detector 655.

Second phase detector 650 can be configured to detect first diffraction (−1) order sub-beam 622, second diffraction (+1) order sub-beam 624, and/or reference illumination beam 614. Second phase detector 650 can be coupled (e.g., electrically) to function generator 630 and/or demodulator 670. Second phase detector 650 can be any optical detector (e.g., CCD, camera, photodiode, photoconductor, phototransistor, CMOS, lock-in CCD, lock-in camera, etc.). In some embodiments, second phase detector 650 can be configured for image based sensing (e.g., all of signal beam, multiple wavelengths). In some embodiments, second phase detector 650 can be coupled (e.g., electrically) to lock-in detector 655.

As shown in FIG. 6, an exemplary aspect of the optical setup of detection system 600 is balanced detection with a lock-in amplifier technique (e.g., heterodyne detection). Both first and second phase detectors 640, 650 can receive reference illumination beam 614. Further, both first and second phase detectors 640, 650 can receive signal beam (e.g. first diffraction (−1) order sub-beam 622 and second diffraction (+1) order sub-beam 624). Signal beam can be normalized (e.g., background subtract reference illumination beam 614 intensity) for balanced detection. First diffraction (−1) order sub-beam 622, with embedded modulation from a first reference signal (e.g., first frequency $f_1$), and second diffraction (+1) order sub-beam 624, with embedded modulation from a second reference signal (e.g., second frequency $f_2$), can be utilized in a lock-in amplifier technique (e.g., heterodyne detection) to improve accuracy and SNR of first diffraction (−1) order sub-beam 622 and second diffraction (+1) order sub-beam 624.

In some embodiments, first phase detector 640 and second phase detector 650 can be configured to collect a signal beam (e.g., first diffraction (−1) order sub-beam 622 and second diffraction (+1) order sub-beam 624) and measure a characteristic (e.g., overlay, alignment, pitch, diffraction order, shift-between-orders (SBO), OPO, OPA, μDBO, intra-field distortion, etc.) of diffraction target 604 based on the signal beam and a first reference signal (e.g., first frequency $f_1$) and a second reference signal (e.g., second frequency $f_2$) from function generator 630. For example, as shown in FIG. 6, a lock-in amplifier technique can be used with the first reference signal (e.g., first frequency $f_1$) and the second reference signal (e.g., second frequency $f_2$) from function generator 630 embedded on first diffraction (−1) order sub-beam 622 and second diffraction (+1) order sub-beam 624, respectively, and a differential value between first diffraction (−1) order sub-beam 622 and second diffraction (+1) order sub-beam 624 can be measured (e.g., phase shift).

In some embodiments, first phase detector 640 and second phase detector 650 can be identical. In some embodiments, first phase detector 640 and second phase detector 650 can be a single detector (e.g., lock-in detector 655). In some embodiments, first phase detector 640 and/or second phase detector 650 can include a lock-in amplifier (e.g., similar to lock-in detector 655). In some embodiments, first phase detector 640 and/or second phase detector 650 can include a built-in lock-in amplifier for each pixel. For example, a lock-in CMOS camera (e.g., C2 heliCam™ by Heliotis AG).

Lock-in detector 655 can be configured to collect a signal beam (e.g., from first and second phase detectors 640, 650) and/or a demodulated signal beam (e.g., from demodulator 670), and measure a characteristic (e.g., overlay, alignment, pitch, diffraction order, shift-between-orders (SBO), OPO, OPA, μDBO, intra-field distortion, etc.) of diffraction target 604 on substrate 602 based on the signal beam and a first reference signal (e.g., first frequency $f_1$) and/or a second reference signal (e.g., second frequency $f_2$) from function generator 630. In some embodiments, lock-in detector 655 can be coupled to function generator 630, first phase detector 640, second phase detector 650, and/or demodulator 670. In some embodiments, lock-in detector 655 can receive a first input signal from first phase detector 640, a second input signal from second phase detector 650, and a first reference signal (e.g., first frequency $f_1$) and a second reference signal (e.g., second frequency $f_2$) from function generator 630 in order to conduct a differential lock-in amplifier technique. For example, a differential (e.g., difference) signal between first and second input signals can be extracted by the first and second reference signals (e.g., heterodyne detection).

In some embodiments, as shown in FIG. 6, lock-in detector 655 can be external to first and second phase detectors 640, 650 and/or demodulator 670. In some embodiments, first phase detector 640, second phase detector 650, and/or demodulator 670 can include lock-in detector 655 (e.g., lock-in detector 655 can be embedded). In some embodiments, as shown in FIG. 7, lock-in detector 655 can include a balanced differential detector 690 configured to output a differential (e.g., difference) signal. For example, as shown in FIG. 5, balanced differential detector 690 can include an adiabatic coupler (e.g., inherent 50% power splitting). In some embodiments, lock-in detector 655 can include a built-in lock-in amplifier for each pixel. For example, a lock-in CMOS camera (e.g., C2 heliCam™ by Heliotis AG). In some embodiments, as shown in FIG. 7, illumination system 610, first phase modulator 620a, second phase modulator 620b, function generator 630, first phase detector 640, second phase detector 650, lock-in detector 655, and/or demodulator 670 can be combined in an integrated optics chip 660.

Demodulator 670 can be configured to separate multiple frequency signals (e.g., detected signals D1-D6) of a signal beam (e.g., first diffraction (−1) order sub-beam 622 and second diffraction (+1) order sub-beam 624). In some embodiments, as shown in FIG. 6, demodulator 670 can be coupled (e.g., electrically) to first and second phase detectors 640, 650 and lock-in detector 655. For example, demodulator 670 can receive an input signal from first and second phase detectors 640, 650, perform frequency-division multiplexing (FDM) for multiple wavelengths of the input signal (e.g., multiple colors), and then send the demodulated signal to lock-in detector 655 for a differential lock-in amplifier technique (e.g., heterodyne detection). In some embodiments, a mixer and multiple filters at different frequency bands for each channel can be utilized. In some embodiments, multiple mixers for each channel can be utilized.

Figure 8:
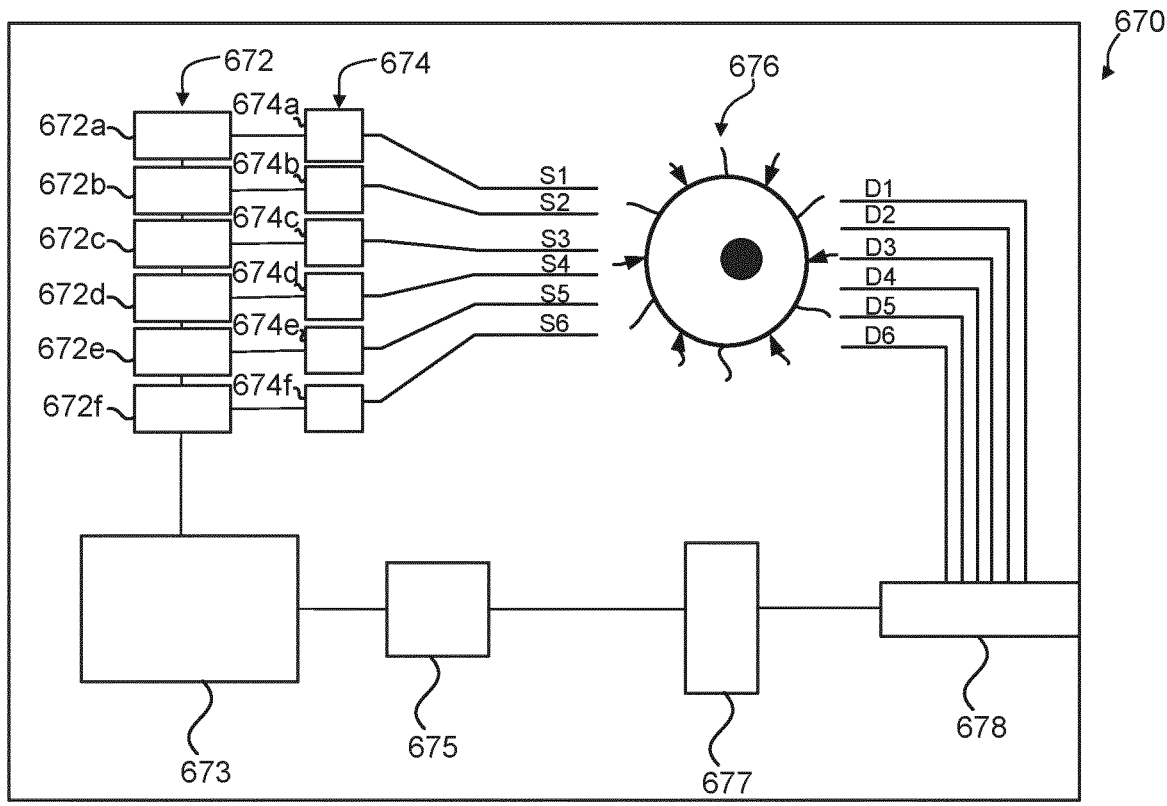
FIG. 8 is a schematic illustration of a demodulator, according to an exemplary embodiment.

As shown in FIG. 8, demodulator 670 can include waveform generator 673, frequency channel 672 (e.g., frequency channels 672a-672f), laser diode 674 (e.g., laser diodes 674a-674f), imaging phantom 676, detector 678, data acquisition (DAQ) 677, and processor (CPU) 675. Processor can be coupled (e.g., electrically) to waveform generator 673 and DAQ 677 and extract a demodulated signal (e.g., detected signals D1-D6) of a signal beam (e.g., first diffraction (−1) order sub-beam 622 and second diffraction (+1) order sub-beam 624). Waveform generator 673 can provide multiple signals to frequency channel 672 (e.g., frequency channels 672a-672f). Frequency channel 672 (e.g., frequency channels 672a-672f) can provide a filtered signal to laser diode 674 (e.g., laser diodes 674a-674f) to produce a frequency-divided input signal (e.g. input signals S1-S6).

Figure 9:
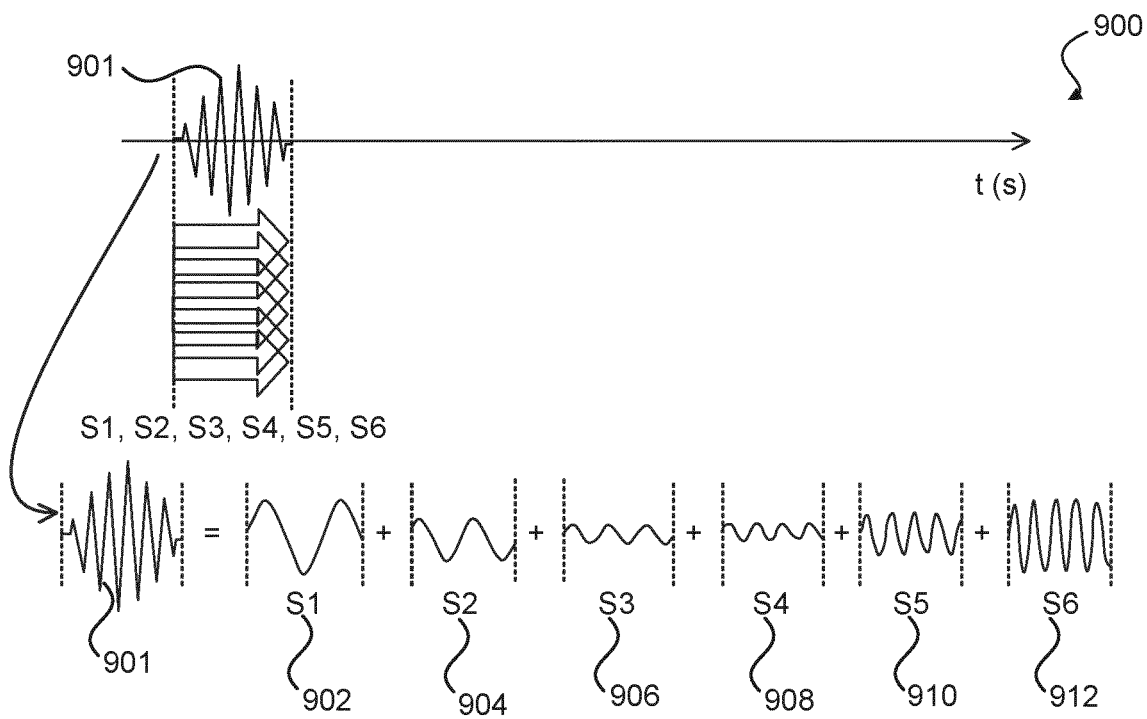
FIG. 9 is a schematic illustration of a demodulated signal, according to an exemplary embodiment.

As shown in FIG. 9, input signal 901 (e.g., first diffraction (−1) order sub-beam 622 and second diffraction (+1) order sub-beam 624) can undergo demodulation 900 to separate (e.g., frequency-divide) input signal 901 into constituent first signal (S1) 902, second signal (S2) 904, third signal (S3) 906, fourth signal (S4) 908, fifth signal (S5) 910, and/or sixth signal (S6) 912.

As shown in FIGS. 6 and 8, imaging phantom 676 can be configured to tune or validate detection of detected signals D1-D6 based on input signals S1-S6. Detected signals D1-D6 can be measured by detector 678 (e.g., 6 corresponding avalanche photodiodes (APDs)) and sent to DAQ 677 and processor 675. Demodulator 670 (e.g., processor 675) can send acquired detected signals D1-D6 to lock-in detector 655 for a lock-in amplifier technique for multiple frequencies and/or wavelengths.

FIG. 7 illustrates detection system 600', according to an exemplary embodiment. The embodiments of detection system 600 shown in FIGS. 6, 8, and 9 and the embodiments of detection system 600' shown in FIG. 7 may be similar. Similar reference numbers are used to indicate similar features of the embodiments of detection system 600 shown in FIGS. 6, 8, and 9 and the similar features of the embodiments of detection system 600' shown in FIG. 7. The main differences between the embodiments of detection system 600 shown in FIGS. 6, 8, and 9 and the embodiments of detection system 600' shown in FIG. 7 is that (1) detection system 600' includes a balanced differential detector 690, rather than first and second phase detectors 640, 650 shown in FIG. 6; (2) detection system 600' includes first grating 642, second grating 644, and third grating 646, rather than third and fourth mirrors 632a, 632b and focusing lens 616 shown in FIG. 6; and (3) detection system 600' combines all of the components of detection system 600 (e.g., illumination system 610, first beamsplitter 606, second beamsplitter 608, reference illumination beam 614, first phase modulator 620a, second phase modulator 620b, function generator 630, first phase detector 640, second phase detector 650, lock-in detector 655, demodulator 670, etc.) into an integrated optics chip 660.

As shown in FIG. 7, an exemplary aspect of the optical setup of detection system 600' is balanced detection with balanced differential detector 690. In some embodiments, balanced differential detector 690 can include an adiabatic coupler (e.g., inherent 50% power splitting). Balanced differential detector 690 can be configured to receive a first input (e.g., reference illumination beam 614) and a second input (e.g., first diffraction (−1) order sub-beam 622 and second diffraction (+1) order sub-beam 624) that can be compared differentially (e.g., difference). Moreover, use of balanced differential detector 690 (e.g., an adiabatic coupler) allows for further miniaturization of detection system 600'. Integrated optics chip 660 provides a single "on chip" sensor for a compact detection system 600' for measuring a particular characteristic (e.g., overlay, alignment, etc.) of diffraction target 604.

As shown in FIG. 7, an exemplary aspect of detection system 600' is balanced detection with reference illumination beam 614 and a lock-in amplifier technique (e.g., heterodyne detection). Balanced differential detector 690 can receive (unmodulated) reference illumination beam 614. First phase modulator 620a receives a first reference signal (e.g., first frequency $f_1$) from function generator 630 and second phase modulator 620b receives a second reference signal (e.g., second frequency $f_2$) from function generator 630. Signal inputs first diffraction (−1) order sub-beam 622 and second diffraction (+1) order sub-beam 624 and reference illumination beam 614 can be subtracted for balanced detection. First diffraction (−1) order sub-beam 622, with embedded modulation from first reference signal (e.g., first frequency $f_1$), and modulated second diffraction (+1) order sub-beam 624, with embedded modulation from second reference signal (e.g., second frequency $f_2$), can be utilized in a lock-in amplifier technique (e.g., heterodyne detection) to improve accuracy and SNR of first diffraction (−1) order sub-beam 622 and second diffraction (+1) order sub-beam 624.

Exemplary On-Axis Lock-In Camera Detection System

Figure 10:
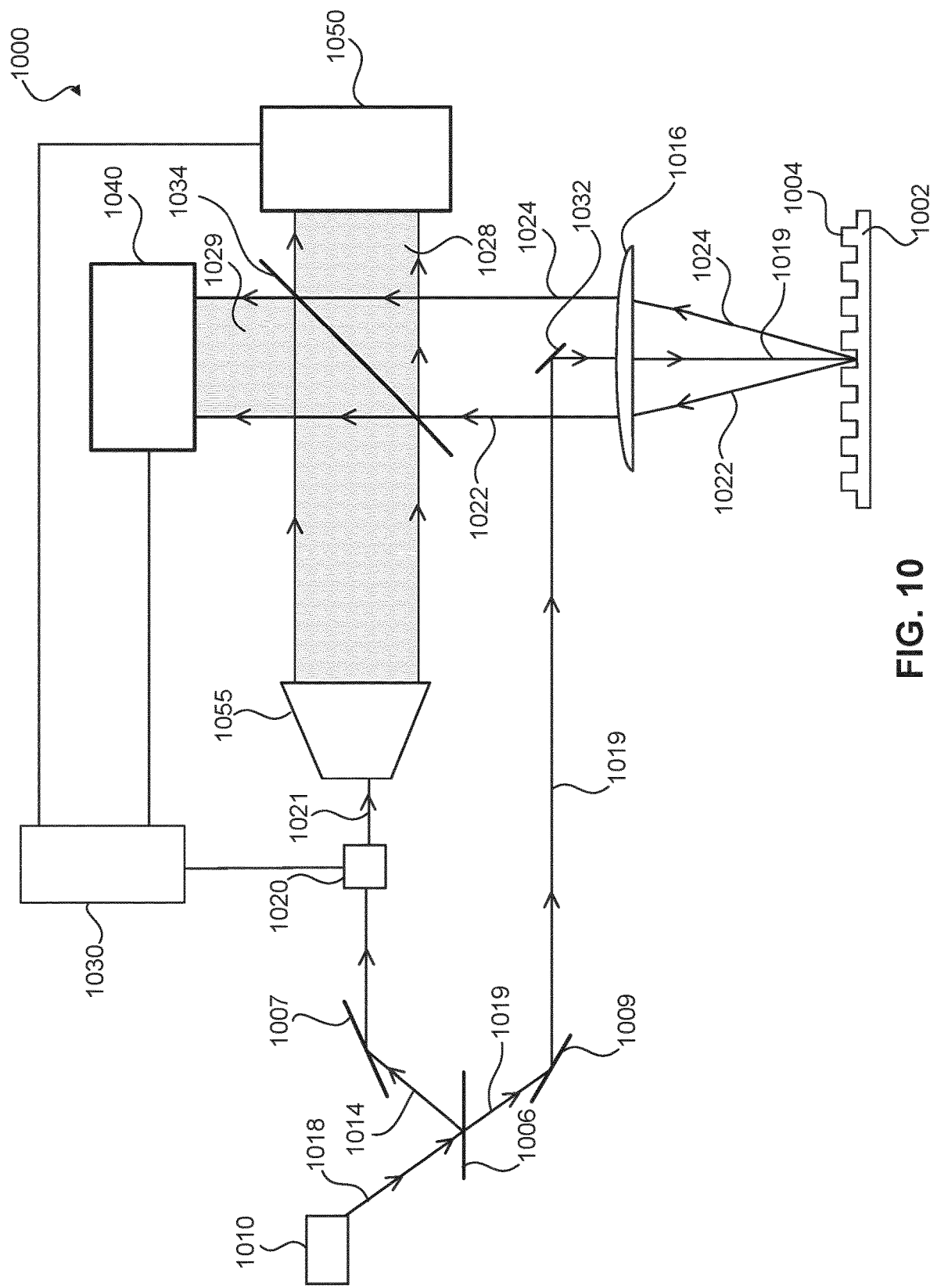
FIG. 10 is a schematic illustration of an on-axis detection system, according to an exemplary embodiment.

FIG. 10 illustrates detection system 1000, according to various exemplary embodiments. Detection system 1000 can be configured to measure a characteristic (e.g., overlay, alignment, pitch, diffraction order, shift-between-orders (SBO), OPO, OPA, µDBO, intra-field distortion, etc.) of a diffraction target 1004 on a substrate 1002 and improve overlay and/or alignment, for example, in lithographic apparatus LA. Although detection system 1000 is shown in FIG. 10 as a stand-alone apparatus and/or system, the embodiments of this disclosure can be used with other optical systems, such as, but not limited to, lithographic apparatus LA and/or other optical systems. In some embodiments, as shown in FIG. 10, detection system 1000 can be an on-axis detection system. In some embodiments, detection system 1000 can include one or more detection cameras (e.g., first and second lock-in cameras 1040, 1050) for image based detection that include a built-in lock-in amplifier for each pixel. For example, first and second lock-in cameras 1040, 1050 can be a lock-in CMOS camera (e.g., C2 heliCam™ by Heliotis AG).

FIG. 10 illustrates detection system 1000, according to an exemplary embodiment. The embodiments of detection system 200 shown in FIG. 2 and the embodiments of detection system 1000 shown in FIG. 10 may be similar. Similar reference numbers are used to indicate similar features of the embodiments of detection system 200 shown in FIG. 2 and the similar features of the embodiments of detection system 1000 shown in FIG. 10. The main differences between the embodiments of detection system 200 shown in FIG. 2 and the embodiments of detection system 1000 shown in FIG. 10 is that (1) detection system 1000 includes a beam expander 1055 that transmits a modulated reference illumination beam 1021 (e.g., based on phase modulator 1020 and reference illumination beam 1014) from illumination system 1010, rather than first diffraction (0th) order sub-beam 226 shown in FIG. 2; (2) detection system 1000 includes third mirror 1032 to block first diffraction (0th) order sub-beam, rather than first beamsplitter 232 shown in FIG. 2; and (3) detection system 1000 includes first and second lock-in cameras 1040, 1050 that receive first and second combined signals 1028, 1029 and modulated reference illumination beam 1021 for image based detection, rather than first phase detector 240, second phase detector 250, and lock-in detector 255 shown in FIG. 2.

As shown in FIG. 10, first and second lock-in cameras 1040, 1050 can be configured to receive a first combined signal 1028, including first diffraction (−1) order sub-beam 1022, second diffraction (+1) order sub-beam 1024, and modulated reference illumination beam 1021, and a second combined signal 1029, including first diffraction (−1) order sub-beam 1022, second diffraction (+1) order sub-beam 1024, and modulated reference illumination beam 1021, respectively, for image based detection using a lock-in amplifier technique (e.g., homodyne detection). For example, as shown in FIG. 10, second beamsplitter 1034 can be used to form first and second combined signals 1028, 1029 for first and second lock-in cameras 1040, 1050, respectively, in order to maximize photon efficiency and detect (1) a relative phase of first diffraction (−1) order sub-beam 1022 and/or second diffraction (+1) order sub-beam 1024 with modulated reference illumination beam 1014; and (2) a relative intensity of diffracted orders first diffraction (−1) order sub-beam 1022 and/or second diffraction (+1) order sub-beam 1024. In some embodiments, an aligned position can be detected by comparing a phase difference between first diffraction (−1) order sub-beam 1022 and/or second diffraction (+1) order sub-beam 1024 and modulated reference illumination beam 1014.

In some embodiments, diffracted orders (e.g., first diffraction (−1) order sub-beam 1022, second diffraction (+1) order sub-beam 1024) can be directly imaged in a pupil plane of detection system 1000. For example, correction of aberrations and/or resolution of individual colors (e.g., wavelengths) can be utilized. In some embodiments, detection system 1000 can include a demodulator (e.g., similar to demodulator 670 shown in FIG. 8). In some embodiments, first and second lock-in cameras 1040, 1050 of detection system 1000 can provide interferometric amplification for shot noise limited performance. In some embodiments, beamsplit illumination beam 1019 can be modulated by phase modulator 1020 rather than reference illumination beam 1014.

Exemplary Off-Axis Lock-In Camera Detection System

Figure 11:
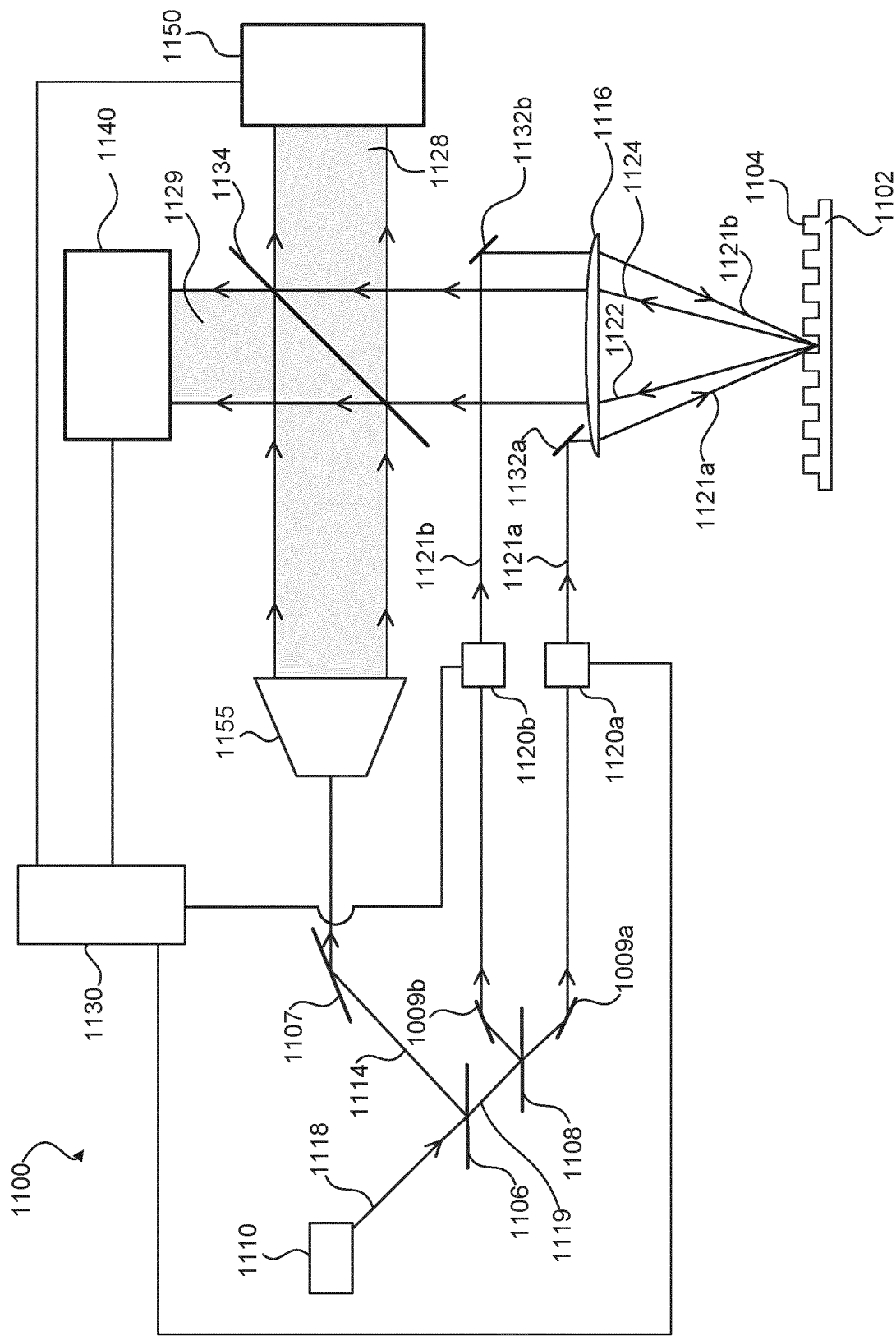
FIG. 11 is a schematic illustration of an off-axis detection system, according to an exemplary embodiment.

FIG. 11 illustrates detection system 1100, according to various exemplary embodiments.

Detection system 1100 can be configured to measure a characteristic (e.g., overlay, alignment, pitch, diffraction order, shift-between-orders (SBO), OPO, OPA, μDBO, intra-field distortion, etc.) of a diffraction target 1104 on a substrate 1102 and improve overlay and/or alignment, for example, in lithographic apparatus LA. Although detection system 1100 is shown in FIG. 11 as a stand-alone apparatus and/or system, the embodiments of this disclosure can be used with other optical systems, such as, but not limited to, lithographic apparatus LA and/or other optical systems. In some embodiments, as shown in FIG. 11, detection system 1100 can be an off-axis detection system. In some embodiments, detection system 1100 can include one or more detection cameras (e.g., first and second lock-in cameras 1140, 1150) for image based detection that include a built-in lock-in amplifier for each pixel. For example, first and second lock-in cameras 1140, 1150 can be a lock-in CMOS camera (e.g., C2 heliCam™ by Heliotis AG).

FIG. 11 illustrates detection system 1100, according to an exemplary embodiment. The embodiments of detection system 600 shown in FIG. 6 and the embodiments of detection system 1100 shown in FIG. 11 may be similar. Similar reference numbers are used to indicate similar features of the embodiments of detection system 600 shown in FIG. 6 and the similar features of the embodiments of detection system 1100 shown in FIG. 11. The main differences between the embodiments of detection system 600 shown in FIG. 6 and the embodiments of detection system 1100 shown in FIG. 11 is that (1) detection system 1100 includes a beam expander 1155 that transmits a reference illumination beam 1114 from illumination system 1110, rather than reference illumination beam 614 (e.g., non-expanded localized spot) shown in FIG. 6; and (2) detection system 1100 includes first and second lock-in cameras 1140, 1150 that receive first and second combined signals 1128, 1129 and reference illumination beam 1114 for image based detection, rather than first phase detector 640, second phase detector 650, and lock-in detector 655 shown in FIG. 6.

As shown in FIG. 11, first and second lock-in cameras 1140, 1150 can be configured to receive a first combined signal 1128, including first diffraction (−1) order sub-beam 1122, second diffraction (+1) order sub-beam 1124, and reference illumination beam 1114, and a second combined signal 1129, including first diffraction (−1) order sub-beam 1122, second diffraction (+1) order sub-beam 1124, and reference illumination beam 1114, respectively, for image based detection using a lock-in amplifier technique (e.g., heterodyne detection). For example, as shown in FIG. 11, third beamsplitter 1134 can be used to form first and second combined signals 1128, 1129 for first and second lock-in cameras 1140, 1150, respectively, in order to maximize photon efficiency and detect (1) a relative phase of first diffraction (−1) order sub-beam 1122 and/or second diffraction (+1) order sub-beam 1124 with reference illumination beam 1114; and (2) a relative intensity of diffracted orders first diffraction (−1) order sub-beam 1122 and/or second diffraction (+1) order sub-beam 1124. In some embodiments, an aligned position can be detected by comparing a phase difference between first diffraction (−1) order sub-beam 1122 and/or second diffraction (+1) order sub-beam 1124 and reference illumination beam 1114.

In some embodiments, diffracted orders (e.g., first diffraction (−1) order sub-beam 1122, second diffraction (+1) order sub-beam 1124) can be directly imaged in a pupil plane of detection system 1100. For example, correction of aberrations and/or resolution of individual colors (e.g., wavelengths) can be utilized. In some embodiments, detection system 1100 can include a demodulator (e.g., similar to demodulator 670 shown in FIG. 8). In some embodiments, first and second lock-in cameras 1140, 1150 of detection system 1100 can provide interferometric amplification for shot noise limited performance.

Other aspects of the invention are set out as in the following numbered clauses.

1. A detection system comprising:
   an illumination system configured to transmit an illumination beam along an illumination path;
   a first optical system configured to transmit the illumination beam toward a diffraction target on a substrate, the first optical system further configured to transmit a signal beam comprising diffraction order sub-beams that are diffracted by the diffraction target;

a phase modulator configured to modulate the illumination beam or the signal beam based on a reference signal;

a lock-in detector configured to collect the signal beam and to measure a characteristic of the diffraction target based on the signal beam and the reference signal; and a function generator configured to generate the reference signal for the phase modulator and the lock-in detector.

2. The detection system of clause 1, wherein the illumination beam comprises a phase modulated illumination beam based on the phase modulator and the reference signal from the function generator.

3. The detection system of clause 1, wherein the illumination beam comprises:

a first phase modulated illumination beam based on a first one of the reference signal from the function generator; and a second phase modulated illumination beam based on a second one of the reference signal from the function generator.

4. The detection system of clause 1, wherein the phase modulator is configured to modulate a first diffraction order sub-beam of the signal beam toward the lock-in detector.

5. The detection system of clause 1, wherein the signal beam comprises a phase modulated signal beam based on the phase modulator and the reference signal from the function generator.

6. The detection system of clause 1, wherein the reference signal comprises a reference illumination beam from the illumination system.

7. The detection system of clause 1, wherein the first optical system comprises a first beamsplitter configured to transmit a first diffraction order sub-beam of the signal beam toward the lock-in detector.

8. The detection system of clause 7, wherein the reference signal comprises the first diffraction order sub-beam of the signal beam.

9. The detection system of clause 1, wherein the illumination system, the lock-in detector, the phase modulator, and the function generator are integrated in an optics chip.

10. The detection system of clause 1, wherein the lock-in detector comprises a built-in lock-in amplifier for each pixel.

11. The detection system of clause 1, wherein the lock-in detector comprises a balanced differential detector configured to output a differential signal.

12. The detection system of clause 11, wherein the balanced differential detector comprises an adiabatic coupler.

13. The detection system of clause 1, wherein the characteristic of the diffraction target is an overlay measurement.

14. The detection system of clause 1, further comprising a demodulator coupled to the lock-in detector and configured to separate multiple frequency signals of the signal beam.

15. The detection system of clause 1, wherein the illumination beam comprises a coherent on-axis illumination beam.

16. The detection system of clause 1, wherein the illumination beam comprises a first coherent off-axis illumination beam and a second coherent off-axis illumination beam.

17. The detection system of clause 1, wherein the illumination system further comprises a tunable filter coupled to the illumination beam and configured to provide a plurality of different illumination beam wavelengths.

18. A lithographic apparatus comprising:

an illumination system configured to illuminate a patterning device;

a projection system configured to project an image of the patterning device onto a substrate; and a detection system configured to measure a characteristic of a diffraction target on the substrate, the detection system comprising:

a second illumination system configured to transmit an illumination beam along an illumination path;

a first optical system configured to transmit the illumination beam toward the diffraction target on the substrate, the first optical system further configured to transmit a signal beam comprising diffraction order sub-beams that are diffracted by the diffraction target;

a phase modulator configured to modulate the illumination beam or the signal beam based on a reference signal;

a lock-in detector configured to collect the signal beam and to measure a characteristic of the diffraction target based on the signal beam and the reference signal; and a function generator configured to generate the reference signal for the phase modulator and the lock-in detector.

19. The lithographic apparatus of clause 18, wherein the characteristic of the diffraction target is an overlay measurement.

20. The lithographic apparatus of clause 18, wherein the characteristic of the diffraction target is an alignment measurement.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments may be implemented in hardware, firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments have been described above, it will be appreciated that the embodiments may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the embodiments and the appended claims in any way.

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the embodiments. Therefore, such adaptations and modifications are intended to be within the meaning and range of equivalents of the disclosed embodiments, based on the teaching and guidance presented herein.

The breadth and scope of the embodiments should not be limited by any of the above-described exemplary embodiments, but should be defined only in accordance with the following claims and their equivalents.

The invention claimed is:

1. A detection system comprising:
   an illumination system configured to transmit an illumination beam along an illumination path;
   a first optical system configured to transmit the illumination beam toward a diffraction target on a substrate, the first optical system further configured to transmit a signal beam comprising diffraction order sub-beams that are diffracted by the diffraction target;
   a phase modulator configured to modulate the illumination beam or the signal beam based on a reference signal;
   a first detector and a second detector, the first detector and the second detector each being configured to receive different respective ones of the diffraction order sub-beams;
   a lock-in detector coupled to the first detector and the second detector and configured to measure a characteristic of the diffraction target based on the reference signal and the diffraction order sub-beams received by the first detector and the second detector; and
   a function generator configured to generate the reference signal for the phase modulator and the lock-in detector.

2. The detection system of claim 1, wherein
   the illumination beam comprises a phase modulated illumination beam based on the phase modulator and the reference signal from the function generator.

3. The detection system of claim 1, wherein the illumination beam comprises:
   a first phase modulated illumination beam based on a first one of the reference signal from the function generator; and
   a second phase modulated illumination beam based on a second one of the reference signal from the function generator.

4. The detection system of claim 1, wherein the phase modulator is configured to modulate a zeroth diffraction order ($0^{th}$ order) sub-beam of the signal beam toward the lock-in detector.

5. The detection system of claim 1, wherein
   the signal beam comprises a phase modulated signal beam based on the phase modulator and the reference signal from the function generator.

6. The detection system of claim 1, wherein
   the reference signal comprises a reference illumination beam from the illumination system.

7. The detection system of claim 1, wherein
the first optical system comprises a first beamsplitter configured to transmit a first diffraction order sub-beam of the signal beam toward the lock-in detector.

8. The detection system of claim 7, wherein
the reference signal comprises the first diffraction order sub-beam of the signal beam.

9. The detection system of claim 1, wherein
the illumination system, the lock-in detector, the phase modulator, and the function generator are integrated in an optics chip.

10. The detection system of claim 1, wherein
the lock-in detector comprises a built-in lock-in amplifier for each pixel.

11. The detection system of claim 1, wherein
the first detector and the second detector constitute a balanced differential detector configured to output a differential signal.

12. The detection system of claim 11, wherein
the balanced differential detector comprises an adiabatic coupler.

13. The detection system of claim 1, wherein the characteristic of the diffraction target is an overlay measurement.

14. The detection system of claim 1, further comprising
a demodulator coupled to the lock-in detector and configured to separate multiple frequency signals of the signal beam.

15. The detection system of claim 1, wherein
the illumination beam comprises a coherent on-axis illumination beam.

16. The detection system of claim 1, wherein
the illumination beam comprises a first coherent off-axis illumination beam and a second coherent off-axis illumination beam.

17. The detection system of claim 1, wherein
the illumination system further comprises a tunable filter coupled to the illumination beam and configured to provide a plurality of different illumination beam wavelengths.

18. A lithographic apparatus comprising:
an illumination system configured to illuminate a patterning device;
a projection system configured to project an image of the patterning device onto a substrate; and
a detection system configured to measure a characteristic of a diffraction target on the substrate, the detection system comprising:
a second illumination system configured to transmit an illumination beam along an illumination path;
a first optical system configured to transmit the illumination beam toward the diffraction target on the substrate, the first optical system further configured to transmit a signal beam comprising diffraction order sub-beams that are diffracted by the diffraction target;
a phase modulator configured to modulate the illumination beam or the signal beam based on a reference signal;
a first detector and a second detector, the first detector and the second detector each being configured to receive different respective ones of the diffraction order sub-beams;
a lock-in detector coupled to the first detector and the second detector and configured to measure a characteristic of the diffraction target based on the reference signal and one or more respective diffraction order sub-beams received by the first detector and the second detector; and
a function generator configured to generate the reference signal for the phase modulator and the lock-in detector.

19. The lithographic apparatus of claim 18, wherein
the characteristic of the diffraction target is an overlay measurement.

20. The lithographic apparatus of claim 18, wherein
the characteristic of the diffraction target is an alignment measurement.

21. A detection system comprising:
an illumination system configured to transmit an illumination beam along an illumination path;
a first optical system configured to transmit the illumination beam toward a diffraction target on a substrate, the first optical system further configured to transmit a signal beam comprising diffraction order sub-beams that are diffracted by the diffraction target;
a phase modulator configured to modulate one or more of the diffraction order sub-beams of the signal beam based on a reference signal;
a first detector and a second detector, the first detector and the second detector each being configured to receive one or more different respective ones of the diffraction order sub-beams;
a lock-in detector connected to the first detector and the second detector and configured to measure a characteristic of the diffraction target based on the modulated diffraction order sub-beams of the signal beam and the reference signal; and
a function generator configured to generate the reference signal for the phase modulator and the lock-in detector.

* * * * *